(12) United States Patent
Sjöland et al.

(10) Patent No.: US 11,546,006 B2
(45) Date of Patent: Jan. 3, 2023

(54) MITIGATION OF INTERMODULATION DISTORTION

(71) Applicant: Telefonaktiebolaget LM Ericsson (publ), Stockholm (SE)

(72) Inventors: Henrik Sjöland, Lund (SE); Lars Sundström, Sodra Sandby (SE)

(73) Assignee: TELEFONAKTIEBOLAGET LM ERICSSON (publ), Stockholm (SE)

( * ) Notice: Subject to any disclaimer, the term of this patent is extended or adjusted under 35 U.S.C. 154(b) by 71 days.

(21) Appl. No.: 17/057,080

(22) PCT Filed: Jun. 1, 2018

(86) PCT No.: PCT/EP2018/064444
§ 371 (c)(1),
(2) Date: Nov. 19, 2020

(87) PCT Pub. No.: WO2019/228638
PCT Pub. Date: Dec. 5, 2019

(65) Prior Publication Data
US 2021/0314009 A1    Oct. 7, 2021

(51) Int. Cl.
*H04B 1/04* (2006.01)
*H03F 3/24* (2006.01)
(Continued)

(52) U.S. Cl.
CPC .......... *H04B 1/0475* (2013.01); *H03F 3/245* (2013.01); *H03F 2200/451* (2013.01); *H04B 2001/0441* (2013.01)

(58) Field of Classification Search
None
See application file for complete search history.

(56) References Cited

U.S. PATENT DOCUMENTS 6,163,213 A    12/2000  Vaktnas
2004/0145415 A1    7/2004  Sun
(Continued)

OTHER PUBLICATIONS

PCT International Search Report, dated Jan. 25, 2019, in connection with International Application No. PCT/EP2018/064444, all pages.
(Continued)

*Primary Examiner* — Pablo N Tran
(74) *Attorney, Agent, or Firm* — Leffler Intellectual Property Law, PLLC

(57) ABSTRACT

A method of a wireless transmitter is disclosed. The method is for mitigation of distortion caused by non-linear hardware components of the transmitter, wherein mitigation of distortion comprises mitigating at least one intermodulation component, wherein the transmitter is configured to process an input signal having an input signal spectrum, and wherein the transmitter comprises two or more signal branches, each signal branch comprising a respective non-linear hardware component. The method comprises modifying the input signal for a first one of the signal branches by applying a first phase shift to a first part of the input signal spectrum, wherein the first phase shift has a first sign and a first absolute value, and applying a second phase shift to a second part of the input signal spectrum. The second phase shift has a second sign which is opposite to the first sign, and a second absolute value which is equal to the first absolute value. The first and second parts are non-overlapping. The method also comprises modifying the input signal for a second one of the signal branches by applying the first phase shift to the second part of the input signal spectrum, and applying the second phase shift to the first part of the input signal spectrum. The method further comprises feeding the modified input signals to respective ones of the signal branches. Corresponding apparatus, wireless transmitter, communica-
(Continued)

tion device, and computer program product are also disclosed.

41 Claims, 9 Drawing Sheets

(51) Int. Cl.
*H03F 3/68* (2006.01)
*H03F 3/21* (2006.01)

(56) References Cited

U.S. PATENT DOCUMENTS

| | | | |
|---|---|---|---|
| 2006/0181344 A1 | 8/2006 | Ksienski et al. | |
| 2007/0249304 A1* | 10/2007 | Snelgrove | H03F 1/0227 455/127.1 |
| 2008/0036536 A1* | 2/2008 | Khorramabadi | H03B 5/1228 330/252 |
| 2020/0328916 A1* | 10/2020 | Nikitin | H04B 1/1027 |

OTHER PUBLICATIONS

PCT Written Opinion, dated Jan. 25, 2019, in connection with International Application No. PCT/EP2018/064444, all pages.
Thomas H. Lee, "The Design of CMOS Radio-Frequency Integrated Circuits, Second Edition", Cambridge University Press, 2003, ISBN: 9780521835398, pp. 701-703.

* cited by examiner

MITIGATION OF INTERMODULATION DISTORTION

TECHNICAL FIELD

The present disclosure relates generally to the field of wireless communication. More particularly, it relates to mitigation of distortion caused by non-linear hardware components of a wireless transmitter.

BACKGROUND

A problem often encountered in relation to typical transmitters is intermodulation distortion. Such distortion may be caused by non-linear hardware components (e.g., power amplifiers) of a wireless transmitter.

The odd orders of such non-linearity cause intermodulation distortion products at frequencies relatively close to the signal modulated for transmission. The distortion is therefore difficult to filter out. However, if left unattended to, such distortion creates disturbances to nearby channels.

Non-linearity is often very hard (if not impossible) to avoid. For example, significant non-linearity must typically be accepted to be able to reach high power amplifier efficiency.

Generally, the width of the frequency range that may be adversely affected by the intermodulation distortion equals the bandwidth of the original (useful) signal multiplied by the order of the non-linearity. Often the third and/or fifth order non-linearity cause problematic distortion. The contaminated spectrum surrounding the original signal (which spectrum would otherwise be available to other communication signals) then equals two times the bandwidth of the useful signal for third order non-linearity, and four times the bandwidth of the useful signal for fifth order non-linearity. When multi-carrier techniques (e.g., carrier aggregation) are used, the situation gets even worse, with contamination which is increased and/or more spread out in frequency.

A common way to address these problems is by application of pre-distortion to compensate for the non-linearity. In pre-distortion approaches, the signal is subjected to an inverse non-linearity function before reaching the dominant non-linearity component (e.g., a power amplifier). The inverse non-linearity inherently widens the signal spectrum. This has the result that the transmitter has to be able to handle a signal bandwidth before the dominant non-linearity component that equals the transmit signal bandwidth multiplied by the order of the highest non-linearity to suppress.

Thus, the wider the bandwidth (of the useful signal and/or of the signal including the intermodulation products to be mitigated); the more demanding requirements on the components in the pre-distortion circuitry and the transmitter signal chain. Hence, the wider the bandwidth; the more costly it is to reduce the intermodulation contamination using pre-distortion.

Furthermore, pre-distortion may typically cause increased power consumption, which may be particularly cumbersome for wideband signals with relatively low output power where the relative power overhead due to pre-distortion becomes significant.

Other problems with intermodulation is that it may be hard to protect vulnerable spectrum parts (e.g., frequency bands hosting Global System for Mobile communication—GSM) from distortion due to intermodulation. This is particularly true for multi-carrier approaches where the intermodulation distortion may be spread out over a huge frequency range.

Therefore, there is a need for additional and/or alternative approaches to mitigation of intermodulation distortion.

It would, for example, be attractive if the need for pre-distortion (or other linearization techniques) could be removed altogether; or at least be subject to less demanding requirements.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

It is an object of some embodiments to solve or mitigate, alleviate, or eliminate at least some of the above or other disadvantages.

According to a first aspect, this is achieved by a method of a wireless transmitter, for mitigation of distortion caused by non-linear hardware components of the transmitter, wherein mitigation of distortion comprises mitigating at least one intermodulation component, wherein the transmitter is configured to process an input signal having an input signal spectrum, and wherein the transmitter comprises two or more signal branches, each signal branch comprising a respective non-linear hardware component.

The method comprises modifying the input signal for a first one of the signal branches by applying a first phase shift to a first part of the input signal spectrum, wherein the first phase shift has a first sign and a first absolute value, and applying a second phase shift to a second part of the input signal spectrum, wherein the second phase shift has a second sign (which is opposite to the first sign) and a second absolute value (which is equal to the first absolute value). The first and second parts are non-overlapping.

The method also comprises modifying the input signal for a second one of the signal branches by applying the first phase shift to the second part of the input signal spectrum, and applying the second phase shift to the first part of the input signal spectrum.

The method further comprises feeding the modified input signals to respective ones of the signal branches.

In some embodiments, mitigation of distortion comprises mitigating an intermodulation component by selecting the first absolute value based on an order of the intermodulation component. The first absolute value may be selected as $\pi/2N$ to mitigate an $N^{th}$ order intermodulation component.

In some embodiments (wherein the two or more signal branches comprises four or more signal branches) the method may further comprise modifying the input signal for a third one of the signal branches by applying a third phase shift to the first part of the input signal spectrum, wherein the third phase shift has a third sign and a third absolute value, and applying a fourth phase shift to the second part of the input signal spectrum, wherein the fourth phase shift has a fourth sign (which is opposite to the third sign) and a fourth absolute value (which is equal to the third absolute value). In such embodiments, the method may also comprise modifying the input signal for a fourth one of the signal branches by applying the third phase shift to the second part of the input signal spectrum and applying the fourth phase shift to the first part of the input signal spectrum.

In some embodiments, mitigation of distortion comprises mitigating first and second intermodulation components by selecting the first and third absolute values based on orders of the first and second intermodulation components. The first and third absolute values may be selected as $\pi/2N \pm \pi/2M$, respectively, to mitigate $N^{th}$ and $M^{th}$ order intermodulation components.

In some embodiments (wherein the two or more signal branches comprises two to the power of x or more signal branches) the method may further comprise modifying the input signal for each one of two to the power of (x−1) of the signal branches by applying different respective first phase shifts to the first part of the input signal spectrum, wherein each respective first phase shift has a respective first sign and a unique respective first absolute value, and applying different respective second phase shifts to the second part of the input signal spectrum, wherein each respective second phase shift has a respective second sign which is opposite to a corresponding first sign, and a respective second absolute value which is equal to a corresponding first absolute value. In such embodiments, the method may also comprise modifying the input signal for each one of two to the power of (x−1) other ones of the signal branches by applying the different respective first phase shifts to the second part of the input signal spectrum, and applying the different respective second phase shifts to the first part of the input signal spectrum.

In some embodiments, mitigation of distortion comprises mitigating x intermodulation components by selecting the unique respective first absolute values based on orders of the intermodulation components. The unique respective first absolute values may be selected as $\pi/2N \pm \pi/2M \pm \ldots \pm \pi/2L$, respectively, to mitigate intermodulation components of orders N, M, . . . , L.

In some embodiments, the method further comprises dynamically selecting one or more intermodulation components for mitigation.

In some embodiments, the method further comprises selecting a partition frequency, wherein the first and second parts of the input signal spectrum reside, respectively, on a first and second side of the partition frequency. The partition frequency may be selected based on respective distortion requirements of frequency intervals adjacent to the input signal spectrum according to some embodiments.

In some embodiments, the first and second parts of the input signal spectrum are, respectively, a first half of the input signal spectrum and a second half of the input signal spectrum.

In some embodiments, the first part of the input signal spectrum is smaller than half of the input signal spectrum and the second part of the input signal spectrum is larger than half of the input signal spectrum.

In some embodiments, wherein the input signal is a carrier aggregation signal, each carrier of the carrier aggregation signal is associated with a respective part of the input signal spectrum.

In some embodiments, the method further comprises generating an output signal for transmission by combining constituent output signals of the signal branches.

In some embodiments, the method further comprises transmitting the output signal.

In some embodiments, the method further comprises transmitting an output signal via beamforming by feeding constituent output signals of the signal branches to respective antenna elements of a beamforming antenna array.

In some embodiments, each of the respective non-linear hardware components comprises a respective non-linear power amplifier.

A second aspect is a computer program product comprising a non-transitory computer readable medium, having thereon a computer program comprising program instructions. The computer program is loadable into a data processing unit and configured to cause execution of the method according to the first aspect when the computer program is run by the data processing unit.

A third aspect is an apparatus for a wireless transmitter, for mitigation of distortion caused by non-linear hardware components of the transmitter, wherein mitigation of distortion comprises mitigation of at least one intermodulation component, wherein the transmitter is configured to process an input signal having an input signal spectrum, and wherein the transmitter comprises two or more signal branches, each signal branch comprising a respective non-linear hardware component.

The apparatus comprises controlling circuitry configured to cause the mitigation of distortion by causing modification of the input signal for a first one of the signal branches by application of a first phase shift to a first part of the input signal spectrum, wherein the first phase shift has a first sign and a first absolute value, and application of a second phase shift to a second part of the input signal spectrum, wherein the second phase shift has a second sign (which is opposite to the first sign) and a second absolute value (which is equal to the first absolute value). The first and second parts are non-overlapping.

The controlling circuitry is also configured to cause modification of the input signal for a second one of the signal branches by application of the first phase shift to the second part of the input signal spectrum, and application of the second phase shift to the first part of the input signal spectrum.

The controlling circuitry is further configured to cause feeding of the modified input signals to respective ones of the signal branches.

A fourth aspect is a wireless transmitter comprising the apparatus of the third aspect.

A fifth aspect is a communication device comprising the apparatus of the third aspect and/or the transmitter of the fourth aspect.

In some embodiments, any of the above aspects may additionally have features identical with or corresponding to any of the various features as explained above for any of the other aspects.

An advantage of some embodiments is that new approaches to mitigation of intermodulation distortion are provided. These approaches may be used alone or in combination with other—known or future—distortion mitigation approaches (e.g., pre-distortion).

Another advantage of some embodiments is that the need for pre-distortion (or other linearization techniques) is removed in some scenarios.

Yet an advantage of some embodiments is that the width of the spectrum contaminated by intermodulation is reduced compared to the prior art.

Another advantage of some embodiments is that, when the need for pre-distortion (or other linearization techniques) remains, it is subject to less demanding requirements than those experienced according to the prior art. This may, at least partly be an effect of the reduction of the width of the contaminated spectrum.

Yet an advantage of some embodiments is that the location—in frequency—of the remaining intermodulation contamination can be controlled. This has the effect that vulnerable spectrum parts can be protected from intermodulation contamination.

BRIEF DESCRIPTION OF THE DRAWINGS

Further objects, features and advantages will appear from the following detailed description of embodiments, with reference being made to the accompanying drawings. The drawings are not necessarily to scale, emphasis instead being placed upon illustrating the example embodiments.

DETAILED DESCRIPTION

Figure 1:
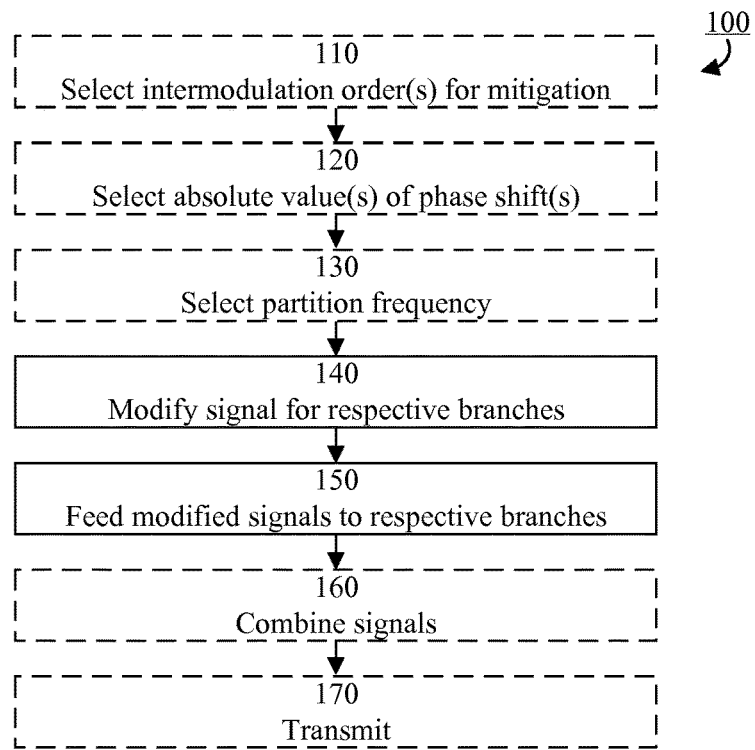
FIG. 1 is a flowchart illustrating example method steps according to some embodiments.

As already mentioned above, it should be emphasized that the term "comprises/comprising" when used in this specification is taken to specify the presence of stated features, integers, steps, or components, but does not preclude the presence or addition of one or more other features, integers, steps, components, or groups thereof. As used herein, the singular forms "a", "an" and "the" are intended to include the plural forms as well, unless the context clearly indicates otherwise.

Embodiments of the present disclosure will be described and exemplified more fully hereinafter with reference to the accompanying drawings. The solutions disclosed herein can, however, be realized in many different forms and should not be construed as being limited to the embodiments set forth herein.

In the following, embodiments for a transmitter will be described providing mitigation of (intermodulation) distortion caused by non-linear hardware components of the transmitter. Generally, it is assumed that the transmitter comprises two or more signal branches, each signal branch comprising a respective non-linear hardware component. Examples of the non-linear hardware components include, but is not limited to, non-linear power amplifiers, mixers, and variable gain amplifiers. Thus, even consequently exemplified herein by power amplifiers, the non-linear hardware components are not limited to power amplifiers only. Contrarily, the non-linear hardware components may, alternatively or additionally comprise other components such as mixers and/or variable gain amplifiers. The distortion mitigation according to embodiments presented herein comprises mitigating at least one intermodulation component caused by the non-linearity.

To obtain high output power in radio frequency (RF) power amplifiers (PAs) it is common to use power combination. In such approaches, several PAs with relatively low output power are typically used (in respective signal branches), wherein their combined output power may enable requirements regarding a relatively high output power to be met. Such approaches are increasingly important since the power capability of, e.g., Complementary Metal Oxide Semiconductor (CMOS) technology is lower for every generation, due to the continuous decrease in feature size.

Power combination may be realized using any suitable approach. For example, transformer based power combiners are common in integrated circuit implementations. Other examples include Wilkinson combiners.

A plurality of power amplifiers are also typically available in antenna array systems.

In the prior art, each PA of such a multiple PA configuration architectures is typically fed the same input signal. The current disclosure suggests that all PAs do not necessarily have to be fed the same input signal, and proposes approaches to how an input signal may be modified for the different signal branches to mitigate intermodulation distortion. By using particular phases for each signal branch and for different parts of the input signal spectrum intermodulation distortion may be mitigated (or even cancelled) when the signals output from the PAs are combined; provided the particular phases and parts of the input signal spectrum are tailored for the mitigation as elaborated on and exemplified herein.

FIG. 1 illustrates an example method 100 of a wireless transmitter according to some embodiments.

The example method 100 starts in step 110, where it is selected which order(s) of intermodulation should be subject of the mitigation. As mentioned above, it is typically the odd orders(s)—and in particular the third and fifth orders—that are most crucial to mitigate. However, embodiments are not limited to mitigation of these order(s) of intermodulation, even if used herein as illustrative examples.

In some embodiments, step 110 may also comprise selecting how many intermodulation components should be subject of the mitigation. This selection is limited by the number of signal branches of the transmitter. If the transmitter has more than one, but less than four, transmission branches (e.g., two signal branches), only one intermodulation component can be subject of the mitigation. If the transmitter has more than three, but less than eight, transmission branches (e.g., four signal branches), up to two intermodulation components can be subject of the mitigation. Generally, if the transmitter has more than $2^x-1$, but less than $2^{x+1}$, transmission branches (e.g., $2^x$ signal branches), up to x intermodulation components can be subject of the mitigation.

Thus, if the transmitter has two signal branches, step 110 may comprise selecting any of the third, fifth, seventh, etc. order intermodulation for mitigation; if the transmitter has four signal branches, step 110 may comprise selecting any combination of (up to) two of the third, fifth, seventh, etc. order intermodulation for mitigation; and if the transmitter has $2^x$ signal branches, step 110 may comprise selecting any combination of (up to) x of the third, fifth, seventh, etc. order intermodulation for mitigation.

In some embodiments, the selection of step 110 may be dynamic regarding the number of intermodulation components and/or which (order of) intermodulation component(s) should be subject of the mitigation. Such dynamic selection may, for example, take changing conditions into account; spectrum profile of the signal to be transmitted, carrier frequency (or combination of carrier frequencies), knowledge of vulnerable spectrum parts, etc. In other embodiments, one or more of the number of intermodulation components and/or which (order of) intermodulation component(s) should be subject of the mitigation is static, and no corresponding selection need to take place according to step 110.

In step 120, unique absolute values of phase shifts are selected based on orders of the intermodulation components. These absolute values are for achieving mitigation of the intermodulation component(s) at hand. Typically, the selection of step 120 follows from the selection of step 110. Hence, if the number and order(s) of intermodulation components are static, the absolute values of the phase shifts are also static and no dynamic selection needs to take place according to step 120.

When only one intermodulation component is subject of the mitigation, only one (a first) absolute value is selected based on an order of the intermodulation component. The first absolute value may be selected as $\varphi=\pi/2N$ to mitigate an $N^{th}$ order intermodulation component. Thus, the first absolute value may be selected as $\pi/6$ to mitigate the third order intermodulation component, as $\pi/10$ to mitigate the fifth order intermodulation component, and so on.

When two (first and second) intermodulation components are subject of the mitigation, two (a first and a third) absolute values are selected based on orders of the first and second intermodulation components. The first and third absolute values may be selected as $\pi/2N\pm\pi/2M$ to mitigate an $N^{th}$ order intermodulation component and an $M^{th}$ order intermodulation component. Thus, the first and third absolute values may be selected as $\pi/15$ and $4\pi/15$ to mitigate the third and fifth order intermodulation components, and so on.

Generally, when x intermodulation components are subject of the mitigation, $2^{(x-1)}$ unique respective absolute values (corresponding to first, third, fifth, etc. absolute values; also referred to herein as unique respective first absolute values of the different respective first phase shifts) are selected based on orders of the intermodulation components. The unique respective absolute values may be selected as $\pi/2N\pm\pi/2M\pm \ldots \pm\pi/2L$ to mitigate intermodulation components of orders N, M, ..., L.

Later herein, it will be exemplified how these particular selections of absolute values of the phase shifts mitigate respective orders of intermodulation components.

In step 130, a partition frequency may be selected. The partition frequency divides the spectrum of an input signal processed by the transmitter in first and second parts residing, respectively, on a first and second side of the partition frequency. For example, the first part of the input signal spectrum may reside below the partition frequency (i.e., comprising frequencies that are lower than the partition frequency) and the second part of the input signal spectrum may reside above the partition frequency (i.e., comprising frequencies that are higher than the partition frequency), or vice versa.

In some embodiments, the partition frequency may be symmetrically placed in relation to the input signal spectrum, such that the first and second parts of the input signal spectrum are, respectively, a first half of the input signal spectrum and a second half of the input signal spectrum.

In some embodiments, the partition frequency may be asymmetrically placed in relation to the input signal spectrum, such that the first part of the input signal spectrum is smaller than half of the input signal spectrum and the second part of the input signal spectrum is larger than half of the input signal spectrum.

In some embodiments, the selection of step 130 may be dynamic. Such dynamic selection may, for example, take changing conditions into account; spectrum profile of the signal to be transmitted, carrier frequency (or combination of carrier frequencies), knowledge of vulnerable spectrum parts, etc. In a typical example, the selection of step 130 comprises the partition frequency based on respective distortion requirements of frequency intervals adjacent to the input signal spectrum. In other embodiments, partition frequency is static, and no dynamic selection needs to take place according to step 130.

When the input signal to be transmitted is a multi-carrier signal (e.g., in accordance with a non-contiguous carrier aggregation approach), each carrier of the carrier aggregation signal is associated with a respective part (i.e., the first or second part) of the input signal spectrum. In such embodiments, rather than selecting a partition frequency as illustrated in step 130, a corresponding selection may comprise selectively associating each carrier with a respective part of the spectrum; and thereby with respective phases for mitigation of intermodulation distortion as will be seen in the following. Thus, the first and/or second parts may be scattered in frequency (comprising one, two, or more frequency intervals).

Generally, however, the first and second parts are non-overlapping.

In step 140, the input signal is modified for each of the signal branches by applying different phase shifts to the first and second parts of the input signal spectrum. In step 150, the modified input signals are fed to respective ones of the signal branches.

For each signal branch, the different phase shifts have the same absolute value and opposite sign. Furthermore, the phase shifts applied, in different signal branches, to the first (or second) part of the input signal spectrum are different for at least $2^x$ of the signal branches. In some embodiments, the phase shifts may be symmetrically distributed around a reference phase, which may, for example, be equal to zero.

Hence, step 140 comprises modifying the input signal for a first one of the signal branches by:
  applying a first phase shift to the first part of the input signal spectrum, wherein the first phase shift has a first sign and a first absolute value, and
  applying a second phase shift to the second part of the input signal spectrum, wherein the second phase shift has a second sign and a second absolute value,
wherein the first and second signs are opposite and the first and second absolute values are equal.

Furthermore, step 140 comprises modifying the input signal for a second one of the signal branches by:
  applying the first phase shift to the second part of the input signal spectrum, and
  applying the second phase shift to the first part of the input signal spectrum.

When there are at least four signal branches, step 140 may comprise modifying the input signal for a third one of the signal branches by:
  applying a third phase shift to the first part of the input signal spectrum, wherein the third phase shift has a third sign and a third absolute value, and
  applying a fourth phase shift to the second part of the input signal spectrum, wherein the fourth phase shift has a fourth sign and a fourth absolute value,
wherein the third and fourth signs are opposite and the third and fourth absolute values are equal.

Furthermore, step 140 may then comprise modifying the input signal for a fourth one of the signal branches by:
  applying the third phase shift to the second part of the input signal spectrum, and
  applying the fourth phase shift to the first part of the input signal spectrum.

Generally, when there are at least $2^x$ signal branches, step 140 may comprise modifying the input signal for each one of $2^{(x-1)}$ of the signal branches by:

applying different respective first phase shifts to the first part of the input signal spectrum, wherein each respective first phase shift has a respective first sign and a unique respective first absolute value, and applying different respective second phase shifts to the second part of the input signal spectrum, wherein each respective second phase shift has a respective second sign and a respective second absolute value, wherein each respective second sign is opposite to a corresponding first sign and each respective second absolute value is equal to a corresponding first absolute value.

Furthermore, step 140 then comprises modifying the input signal for each one of $2^{(x-1)}$ other ones of the signal branches by:

applying the different respective first phase shifts to the second part of the input signal spectrum, and applying the different respective second phase shifts to the first part of the input signal spectrum.

The constituent output signals of the signal branches may then be transmitted as illustrated in step 170.

For example, a signal may be transmitted via beamforming by feeding constituent output signals of the signal branches to respective antenna elements of a beamforming antenna array. This is an approach utilizing combining of the constituent output signals "in the air". Then, the distortion bandwidth may be reduced in the direction of the beam.

Alternatively or additionally, an output signal, which is then transmitted in step 170, may be generated by combining (e.g., adding) constituent output signals of the signal branches as illustrated in step 160.

Figure 2:
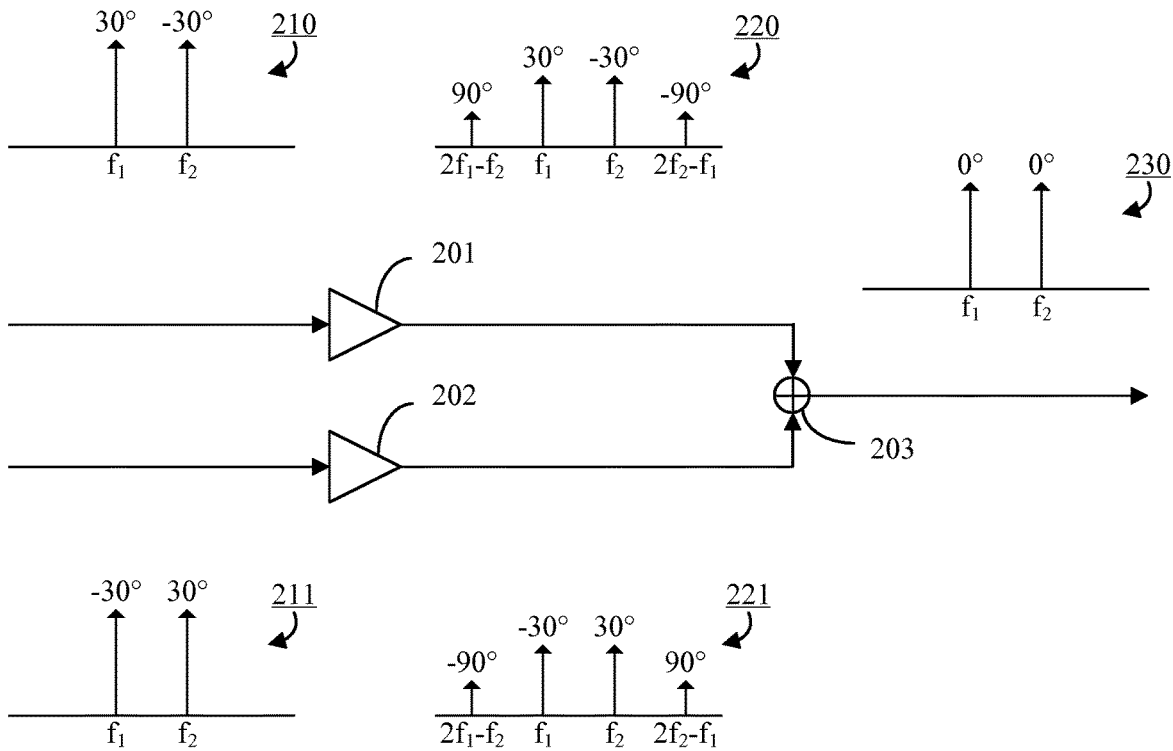
FIG. 2 is a schematic drawing illustrating example principles according to some embodiments.

FIG. 2 schematically illustrates example principles according to embodiments where (only) the third order intermodulation component is to be subject to mitigation. For illustration purposes, a situation with a two-tone input signal (with tones at the frequencies $f_1$ and $f_2$) is considered. In such a scenario, the third order intermodulation components can be completely cancelled, and the partition frequency can be seen as having a value between $f_1$ and $f_2$.

As mentioned above, at least two signal branches are needed for cancellation of one intermodulation component, and this is exemplified in FIG. 2 by a first signal branch comprising a non-linear component 201 and a second signal branch comprising a non-linear component 202. As also mentioned above, the first absolute value may be selected as $\varphi=\pi/6$ (i.e., 30°) to mitigate (only) the third order intermodulation component.

The modified input signals fed to each of the two signal branches are illustrated by 210 and 211. As can be seen at 210, the input signal has been modified for the first signal branch by application of a first phase shift (30°) to the first part ($f_1$) of the input signal spectrum and application of a second phase shift (−30°) to the second part ($f_2$) of the input signal spectrum, wherein the first and second phase shifts have opposite signs and the same absolute values. As can be seen at 211, the input signal has been modified for the second signal branch by application of the first phase shift (30°) to the second part ($f_2$) of the input signal spectrum and application of the second phase shift (−30°) to the first part ($f_1$) of the input signal spectrum.

After having been subjected to the third order non-linearity of the hardware components 201 and 202, each of the modified input signals 210 and 211 will have the signal composition shown at 220 and 221, respectively.

The constituent output signal 220 of the first signal branch comprises tones at the frequencies $f_1$ and $f_2$ (with phase shifts 30° and −30°, respectively), as well as third order intermodulation tones at frequencies $2f_1-f_2$ and $2f_2-f_1$ (with phase shifts 90° and −90°, respectively).

Correspondingly, the constituent output signal 221 of the second signal branch comprises tones at the frequencies $f_1$ and $f_2$ (with phase shifts −30° and 30°, respectively), as well as third order intermodulation tones at frequencies $2f_1-f_2$ and $2f_2-f_1$ (with phase shifts −90° and 90°, respectively).

When the constituent output signals 220 and 221 are combined (e.g., in adding circuitry 203), the third order intermodulation components combine destructively due to having phases ±90° and thereby cancel each other as can be seen in the resulting signal for transmission 230.

The in-phase parts of the desired signal tones at the frequencies $f_1$ and $f_2$ combine into signal tones at the frequencies $f_1$ and $f_2$ with respective phase shift 0° as illustrated at 230.

There may be a loss due to the partially destructive combination of the desired signal tones at the frequencies $f_1$ and $f_2$, due to that (assuming a reference magnitude equal to one) the in-phase parts which combine constructively have a magnitude of $\cos \varphi$ while the quadrature-phase parts which combine deconstructive have a magnitude of $\sin \varphi$ and opposite signs. To compensate for this loss, the processing of the input signal in each of the signal branches may comprise amplification by $1/\cos \varphi$.

If the PA outputs are combined in power, e.g. using hybrid combiners, there will be a slight loss in power due each frequency component of respective PA output being somewhat out of phase as exemplified above. For example, with ±30°, the power loss will be 1.2 dB.

If the PA outputs are combined primarily in current or voltage, e.g. using transformers, there will (ideally) be no transmission loss.

Generally, the phases should be selected such that intermodulation tones (corresponding to intermodulation components subject to mitigation) of different signal branches cancel each other when combined.

For the example of two signal branches, the phases should be selected such that intermodulation tones in the two branches are 180° out of phase (i.e., ±90°); which is achieved with ±30° for third order intermodulation, with ±18° for fifth order intermodulation, etc.

For the example of four signal branches, intermodulation tones of third and fifth orders may be canceled if phases are selected as ±12° and ±48° (i.e., $f_1$ is modified by 12° for a first signal branch, by 48° for a second signal branch, by −12° for a third signal branch, and by −48° for a fourth signal branch; while $f_2$ is modified by −12° for the first signal branch, by −48° for the second signal branch, by 12° for the third signal branch, and by 48° for the fourth signal branch). The third order intermodulation tone at $2f_1-f_2$ will then have phases 36° for the first signal branch, 144° for the second signal branch, −36° for the third signal branch, and −144° for the fourth signal branch; which makes the first and second branches combine to 90° and the third and fourth branches combine to −90°, resulting in cancellation at combining.

Corresponding cancellation takes place for the other third order intermodulation tone. The fifth order intermodulation tone at $3f_1-2f_2$ will have phases 60° for the first signal branch, 240° for the second signal branch, −60° for the third signal branch, and −240° for the fourth signal branch, resulting in cancellation at combining. Corresponding cancellation takes place for the other fifth order intermodulation tone.

Figure 3:
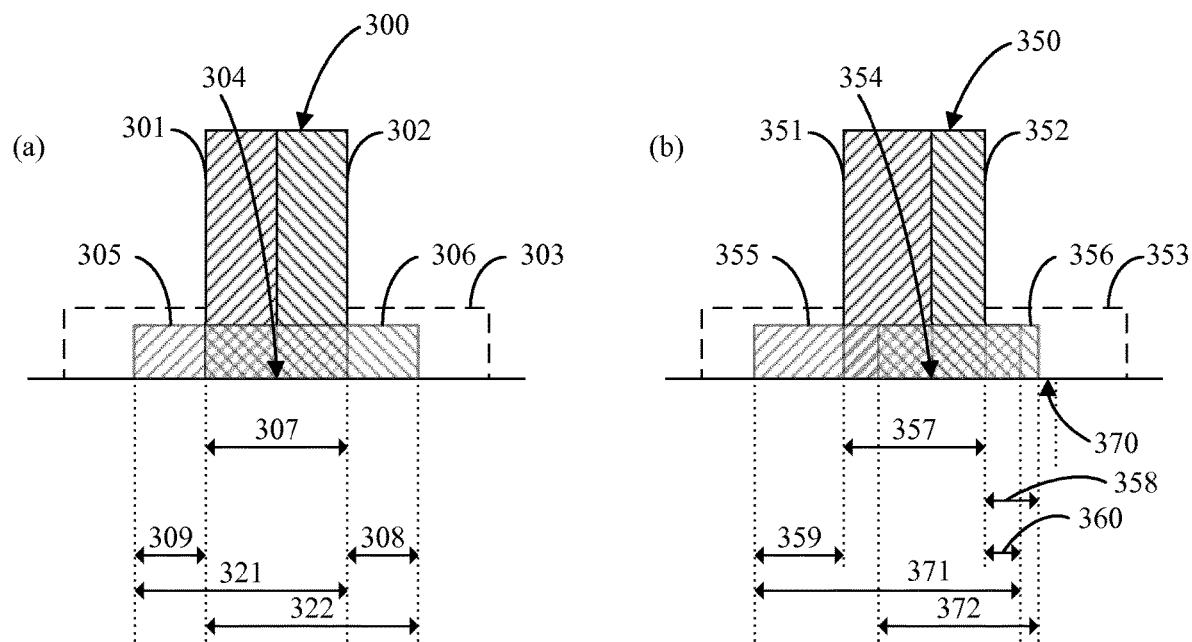
FIG. 3 is a schematic drawing illustrating example principles according to some embodiments.

FIG. 3 also schematically illustrates example principles according to embodiments where (only) the third order intermodulation component is to be subject to mitigation. In this Figure, a situation with a square-formed input signal spectrum 300, 350 is considered. In scenarios other than pure-tone scenarios, intermodulation components can typically not be completely cancelled. However, as will be illustrated by this example, the distortion bandwidth can be considerably reduced compared to what is achievable by prior art techniques. In typical prior art situations (e.g., if pre-distortion is applied), the transmitter will need to handle—on each side of the useful signal—a distortion bandwidth that equals the bandwidth 307, 357 of the useful signal. This is illustrated by 303 and 353 in FIG. 3.

FIG. 3 illustrates two different partition frequency placements. A symmetric scenario is illustrated by part (a) of FIG. 3, where the partition frequency 304 is placed at a center frequency of the input signal spectrum 300. An asymmetric scenario is illustrated by part (b) of FIG. 3, where the partition frequency 354 is placed at a frequency which is higher than the center frequency of the input signal spectrum 350.

Similarly to FIG. 2, the input signal is modified for the first signal branch by application of a first phase shift (30°) to the first part 301, 351 of the input signal spectrum and application of a second phase shift (−30°) to the second part 302, 352 of the input signal spectrum, as well as modified for the second signal branch by application of the first phase shift (30°) to the second part 302, 352 of the input signal spectrum and application of the second phase shift (−30°) to the first part 301, 351 of the input signal spectrum.

After having been subjected to the respective non-linearity of the hardware components and combined, the remaining intermodulation distortion may be illustrated by 305 and 306 in the symmetric scenario (a) and by 355 and 356 in the asymmetric scenario (b). As can be seen, the bandwidth of the remaining intermodulation distortion is less than the distortion bandwidth 303, 353 experienced when prior art approaches are applied. In fact, the accumulated (from both sides of the useful signal) bandwidth of the remaining intermodulation distortion is half of the distortion bandwidth 303, 353 of prior art approaches.

In the symmetrical scenario (a), the remaining intermodulation distortion 305 corresponding to first signal part has a bandwidth 321 that is 50% larger than the bandwidth 307 of the useful signal (three times the bandwidth of the first signal part 301), and the only frequency interval that is contaminated outside the bandwidth 307 of the useful signal is the interval illustrated at 309.

Similarly, the remaining intermodulation distortion 306 corresponding to second signal part has a bandwidth 322 that is 50% larger than the bandwidth 307 of the useful signal (three times the bandwidth of the second signal part 302), and the only frequency interval that is contaminated outside the bandwidth 307 of the useful signal is the interval illustrated at 308.

In the asymmetrical scenario (b), the remaining intermodulation distortion 355 corresponding to first signal part has a bandwidth 371 that is 50-200% larger than the bandwidth 357 of the useful signal (three times the bandwidth of the first signal part 351), depending on where the partition frequency is placed, and the frequency intervals that are contaminated outside the bandwidth 357 of the useful signal are the intervals illustrated at 359 and 360.

Correspondingly, the remaining intermodulation distortion 356 corresponding to second signal part has a bandwidth 372 that is 0-50% larger than the bandwidth 357 of the useful signal (three times the bandwidth of the second signal part 352), depending on where the partition frequency is placed, and the only frequency interval that is contaminated outside the bandwidth 357 of the useful signal is the interval illustrated at 358.

It can be seen that, by placing the partition frequency asymmetrically, a frequency band 370 on one side of the useful signal may be subjected to less distortion contamination than a corresponding frequency band on the other side of the useful signal, and also compared to the distortion contamination it would have been submitted to in the symmetrical scenario (a), which may be particularly attractive if the frequency band 370 is vulnerable in some sense (e.g., comprising a signal which should preferably be protected from interference).

A maximum effect to this end is achieved when the high-frequency (or low-frequency when the partition frequency is placed at a frequency lower than the center frequency of the input signal spectrum) boundaries of the intermodulation distortion parts 355, 356 coincide. For third order cancellation, this is achieved when the partition frequency is placed at the center frequency plus/minus one sixth of the bandwidth of the useful signal. For fifth order cancellation, this is achieved when the partition frequency is placed at the center frequency plus/minus one tenth of the bandwidth of the useful signal. For $N^{th}$ order cancellation, this is achieved when the partition frequency is placed at the center frequency plus/minus ½N of the bandwidth of the useful signal.

Thus, FIG. 3 illustrates situations where intermodulation remains for each part of the input signal spectrum, but since each side has a lower bandwidth than that of the useful signal (e.g., half the bandwidth of the useful signal in the symmetric case (a)) the total bandwidth of the intermodulation is also reduced (e.g., halved in the symmetric case, where each of the frequency intervals 308, 309 amounts to half of the corresponding part of 303 protruding outside the useful signal spectrum 300).

Generally, it should be noted that significant reduction of intermodulation distortion is also achieved in a frequency interval close to the intermodulation spectrum edges.

Also generally, it should be noted that the spectrum may be partitioned into more than two parts according to some embodiments, e.g., by application of more than one partition frequency.

Figure 4:
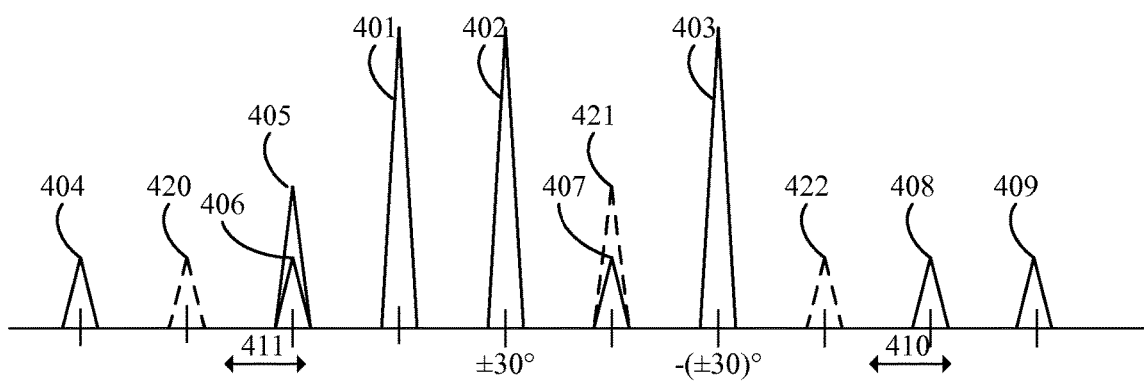
FIG. 4 is a schematic drawing illustrating example principles according to some embodiments.

FIG. 4 schematically illustrates an example carrier aggregation scenario with three non-contiguous component carrier signals 401, 402, 403 and corresponding third order intermodulation components 404, 405, 406, 407, 408, 409, 420, 421, 422, where the dashed intermodulation components 420, 421, 422 are triple-beat intermodulation components. If, for example, the spectrum 410 is particularly vulnerable to interference, the intermodulation component 408 may be mitigated by letting the component carrier signals 402 and 403 belong to different ones of the first and second parts of the input signal spectrum (the component carrier signal 401 can belong to either one of the first and second parts; which is not important in relation to the mitigation of 408).

Thus, in a first signal branch a first phase shift (e.g., 30°) is applied to the component carrier signal 402 and a second phase shift (e.g., −30° is applied to the component carrier signal 403, and oppositely in a second signal branch, which mitigates the intermodulation component 408 (and the intermodulation component 405) in a similar manner as has been described in relation to FIGS. 2 and 3.

As mention just above, it is not important in relation to the mitigation of 408 which of the first and second parts the component carrier signal 401 belongs to. However, selection of which part the component carrier signal 401 belongs to enables control over mitigation of other ones of the component carriers.

If the component carrier signal 401 belongs to the same one of the first and second parts as the component carrier signal 402 intermodulation components 404 and 409 will be subject to mitigation. If the component carrier signal 401 belongs to the same one of the first and second parts as the component carrier signal 403 intermodulation components 406 and 407 will be subject to mitigation.

Thus, if the spectrum 411 is particularly vulnerable to interference, the intermodulation components 405 and 406 may be mitigated by letting the component carrier signals 401 and 402 belong to different ones of the first and second parts of the input signal spectrum and letting the component carrier signals 402 and 403 belong to different ones of the first and second parts of the input signal spectrum.

Generally in multi-carrier scenarios, one or more pairs of component carriers may be formed (depending on which intermodulation is to be subject to mitigation), wherein the component carriers of each pair belong to different ones of the first and second part of the input signal spectrum.

Even more generally in multi-carrier scenarios, one or more groups of component carriers may be formed (e.g. a group with three members for mitigation of a triple-beat intermodulation component), wherein the component carriers of each group use suitable and inter-related phase shifts for mitigation. For example, if an intermodulation component appearing at a frequency $f_1+f_2-f_3$ is to be mitigated, then the carriers at $f_1$ and $f_2$ may undergo the same phase shift, which is opposite to that applied to $f_3$.

Approaches where the spectrum is partitioned into more than two parts may be applicable to the carrier aggregation scenario.

Of course, the approaches exemplified for carrier aggregation may be modified to mitigate other order(s) of intermodulation as explained herein (e.g., in the context of FIGS. 1-3).

Figure 5:
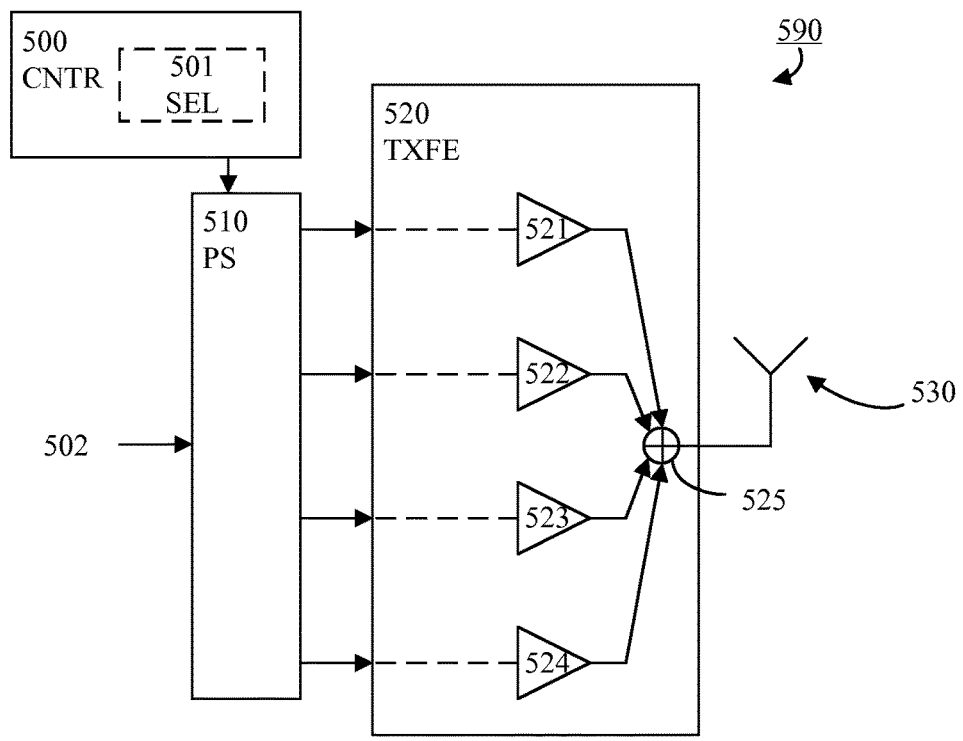
FIG. 5 is a schematic block diagram illustrating an example apparatus according to some embodiments.

FIG. 5 is a schematic block diagram illustrating an example apparatus 590 for a wireless transmitter according to some embodiments. The apparatus is for mitigation of distortion caused by non-linear hardware components of the wireless transmitter, wherein mitigation of distortion comprises mitigation of at least one intermodulation component.

For example, the apparatus may be configured to perform (or cause performance of) one or more method steps as described earlier herein; e.g., in connection with FIG. 1. The apparatus may be comprised in, or otherwise associated with a wireless transmitter and/or a communication device (e.g., a network node or user terminal).

The wireless transmitter has a transmitter front end (TXFE) 520 comprising four signal branches, each comprising a respective non-linear hardware component 521, 522, 523, 524, and is configured to process an input signal 502 having an input signal spectrum.

The apparatus comprises controlling circuitry (e.g., a controller; CNTR) 500 configured to cause the mitigation of distortion by causing execution of one or more method steps as described earlier herein; e.g., in connection with FIG. 1.

The controlling circuitry may be configured to cause one or more of the selections described in connection with steps 110, 120, 130 of FIG. 1. To this end, the controlling circuitry may comprise, or be otherwise associated with, selection circuitry (e.g., a selector, SEL) 501 configured to perform one or more of the selections described in connection with steps 110, 120, 130 of FIG. 1.

The controlling circuitry is also configured to cause the modification of the input signal 502 for each one of the signal branches by application of respective phase shifts as described earlier herein (compare with step 140 of FIG. 1), and feeding of the modified input signals to respective ones of the signal branches (compare with step 150 of FIG. 1). To this end, the controlling circuitry may comprise, or be otherwise associated with, phase shift circuitry (e.g., a phase shifter, PS) 510 configured to perform the modification of the input signal and feeding of the modified input signals to respective signal branches.

The controlling circuitry may be further configured to cause generation of an output signal for transmission by causing combining of constituent output signals of the signal branches. To this end, the controlling circuitry may comprise, or be otherwise associated with, combining circuitry (e.g., a combiner) 525 configured to perform the combining. The controlling circuitry may be further configured to cause transmission of the output signal, e.g. via one or more antenna elements 530.

Figure 6:
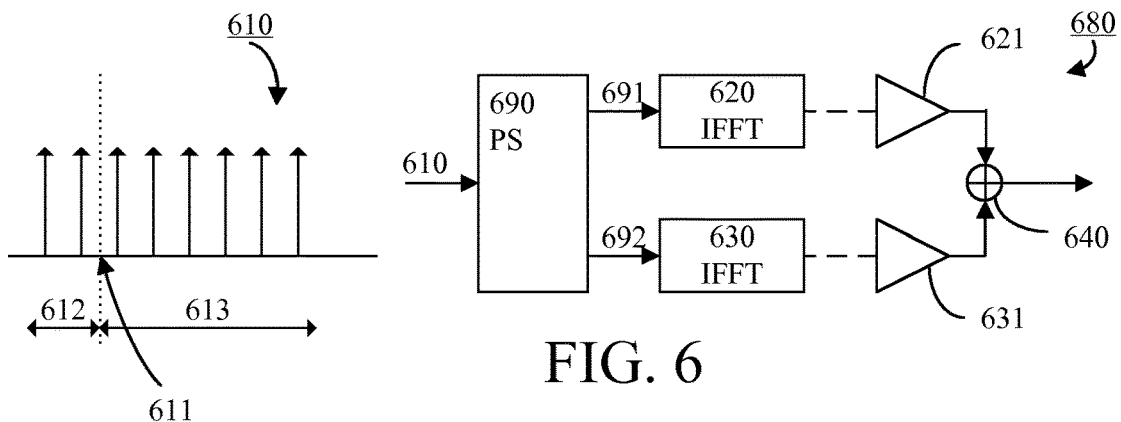
FIG. 6 is a schematic block diagram illustrating an example apparatus according to some embodiments.

FIG. 6 is a schematic block diagram illustrating an example apparatus 680 for a wireless transmitter according to some embodiments; particularly usable when the input signal is an orthogonal frequency division multiplex (OFDM) signal. The apparatus is for mitigation of distortion caused by non-linear hardware components of the wireless transmitter, wherein mitigation of distortion comprises mitigation of at least one intermodulation component.

For example, the apparatus may be configured to perform (or cause performance of) one or more method steps as described earlier herein; e.g., in connection with FIG. 1. The apparatus may be comprised in, or otherwise associated with a wireless transmitter and/or a communication device (e.g., a network node or user terminal).

The wireless transmitter comprises two signal branches, each comprising a respective non-linear hardware component 621, 631, and is configured to process an input signal 610 having an input signal spectrum.

The input signal spectrum is schematically exemplified via the sub-carriers of an OFDM signal. The partition frequency 611 is asymmetrically placed; dividing the input signal spectrum into a lower signal part $s_l$ 612 and an upper signal part $s_u$ 613.

The input signal is subjected to modification in phase shift circuitry (PS) 690 and fed to respective signal branches. In a typical example, the modified signal 691 fed to the first signal branch may be expressed as $s_u e^{i\varphi}+s_l e^{-i\varphi}$ while the modified signal 692 fed to the second signal branch may be expressed as $s_u e^{-i\varphi}+s_l e^{i\varphi}$, where $\varphi=\pi/2N$ for mitigation of the intermodulation component of order N.

In the respective signal branch, the modified input signal is processed by inverse fast Fourier transform circuitry (IFFT) 620, 630 and subjected to the non-linearity of components 621, 631.

Then, an output signal for transmission is generated by combining, in combining circuitry 640, the constituent output signals of the signal branches.

In various embodiments, one or more features of each of the apparatuses illustrated in FIGS. 5 and 6 may be combined into other apparatuses as suitable.

Generally, the phase shifts may be applied in any suitable manner. Typically, they may be applied in the digital domain (e.g., in a digital front end of the transmitter), i.e., before digital-to-analog conversion.

In some embodiments, the phase shifts may be most easily applied in a frequency domain, and if the air interface is based on OFDM this is easily achieved. For example, they may be applied in association with (e.g., before) application of inverse fast Fourier transform (IFFT) if a separate IFFT is available for each signal branch.

It should be noted that—in contrast to linearization approaches like pre-distortion—embodiments presented herein typically only involve linear signal processing. This provides for simple implementation. Furthermore, bandwidth expansion of the input signal prior to the non-linear hardware components (e.g., PAs) may be avoided. In addition, tuning or adaptation of parameters is typically not needed for the approaches presented herein to work properly, at least as long as the hardware components (e.g., PAs) are well matched.

By using solutions presented herein, the amount of intermodulation distortion can be reduced in transmitters and, possibly even more importantly in some scenarios, the bandwidth of the distortion can be reduced significantly.

Negative impact of distortion on system performance may be reduced. Alternatively or additionally, the required bandwidth for pre-distortion circuitry may be reduced.

As is evident from this disclosure, any order of non-linearity may be addressed and the selection of intermodulation order(s) to mitigate can easily be changed during operation.

It is possible to tailor the appearance of the distortion spectrum. For example, one side of the distortion spectrum can be reduced at the expense of the other side.

As is evident from this disclosure, it is also possible to simultaneously mitigate intermodulation products of more than one order, by using four or more branches.

The importance of distortion bandwidth reduction is expected to increase with wideband signals being used in fifth generation (5G) communication systems, and also in fourth generation (4G) communication systems with carrier aggregation.

The described embodiments and their equivalents may be realized in software or hardware or a combination thereof. The embodiments may be performed by general purpose circuitry. Examples of general purpose circuitry include digital signal processors (DSP), central processing units (CPU), co-processor units, field programmable gate arrays (FPGA) and other programmable hardware. Alternatively or additionally, the embodiments may be performed by specialized circuitry, such as application specific integrated circuits (ASIC). The general purpose circuitry and/or the specialized circuitry may, for example, be associated with or comprised in an apparatus such as a wireless communication device or a network node.

Embodiments may appear within an electronic apparatus (such as a wireless communication device or a network node) comprising apparatus(es), circuitry, and/or logic according to any of the embodiments described herein. Alternatively or additionally, an electronic apparatus (such as a wireless communication device or a network node) may be configured to perform methods according to any of the embodiments described herein.

Figure 7:
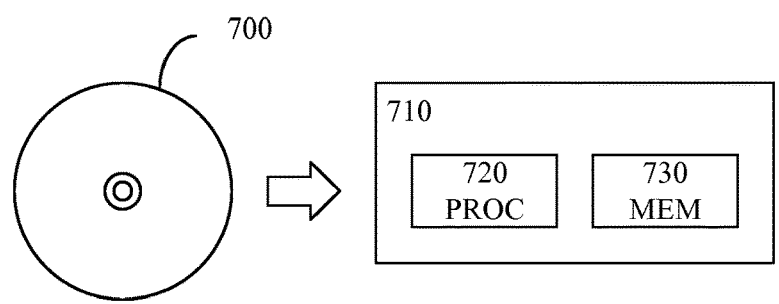
FIG. 7 is a schematic drawing illustrating an example computer readable medium according to some embodiments.

According to some embodiments, a computer program product comprises a computer readable medium such as, for example a universal serial bus (USB) memory, a plug-in card, an embedded drive or a read only memory (ROM). FIG. 7 illustrates an example computer readable medium in the form of a compact disc (CD) ROM 700. The computer readable medium has stored thereon a computer program comprising program instructions. The computer program is loadable into a data processor (PROC) 720, which may, for example, be comprised in a wireless communication device or a network node 710. When loaded into the data processing unit, the computer program may be stored in a memory (MEM) 730 associated with or comprised in the data-processing unit. According to some embodiments, the computer program may, when loaded into and run by the data processing unit, cause execution of method steps according to, for example, any of the methods as illustrated in FIG. 1 or otherwise described herein.

Some example simulation results will now be presented with reference to FIGS. 8-14. The term "cancellation" will be used in the following, also to describe mitigation which is not complete cancellation. The simulations were performed to test the validity of the concept presented herein. The simulation setup was with multiple tones and an ideal polynomial non-linearity. The test-bench comprised voltage sources producing the tones; feeding voltage-controlled voltage sources (vcvs) with polynomial transfer. Equal vcvs were used, one per branch, with their outputs series connected to add the voltages. The inputs of the vcvs were connected to sinusoidal voltage source (vsin) sources creating the tones. The initial phases of the tones were set according to the approaches presented herein.

Figure 8:
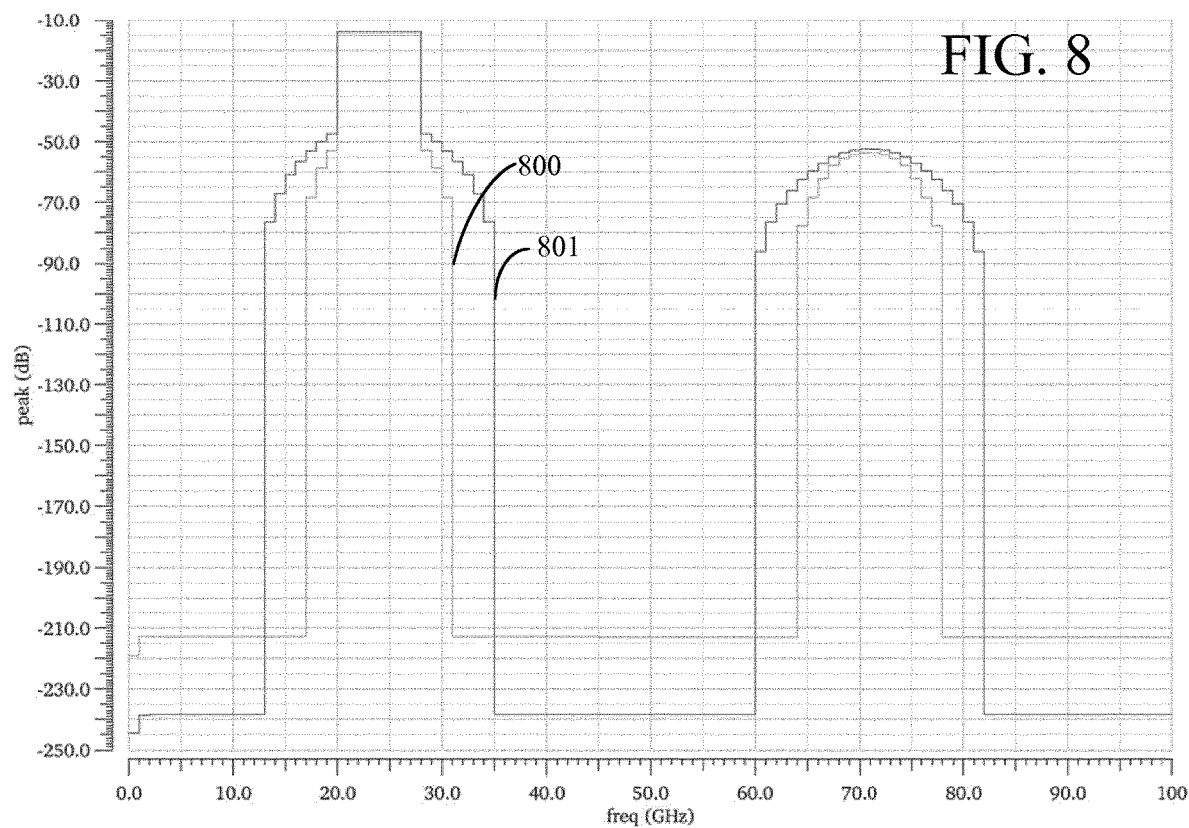
FIGS. 8-14 are simulation plots illustrating various example phenomena according to some embodiments.

A third order intermodulation was generated using a third order polynomial in the vcvs and the cancellation was investigated. The phase shifts of the input tones were ±30° and the partition frequency was the center frequency. The two branches (vcvs) had opposite phase shifts for the input tones. The resulting signal spectrum 800 is shown in FIG. 8, together with a spectrum 801 without cancellation (zero phase shift) for comparison. It can be seen that the cancellation narrows the spectrum of the third order intermodulation both near the carriers (at 20-27 GHz) and in the third harmonic zone (in the vicinity of 70 GHz).

Figure 9:
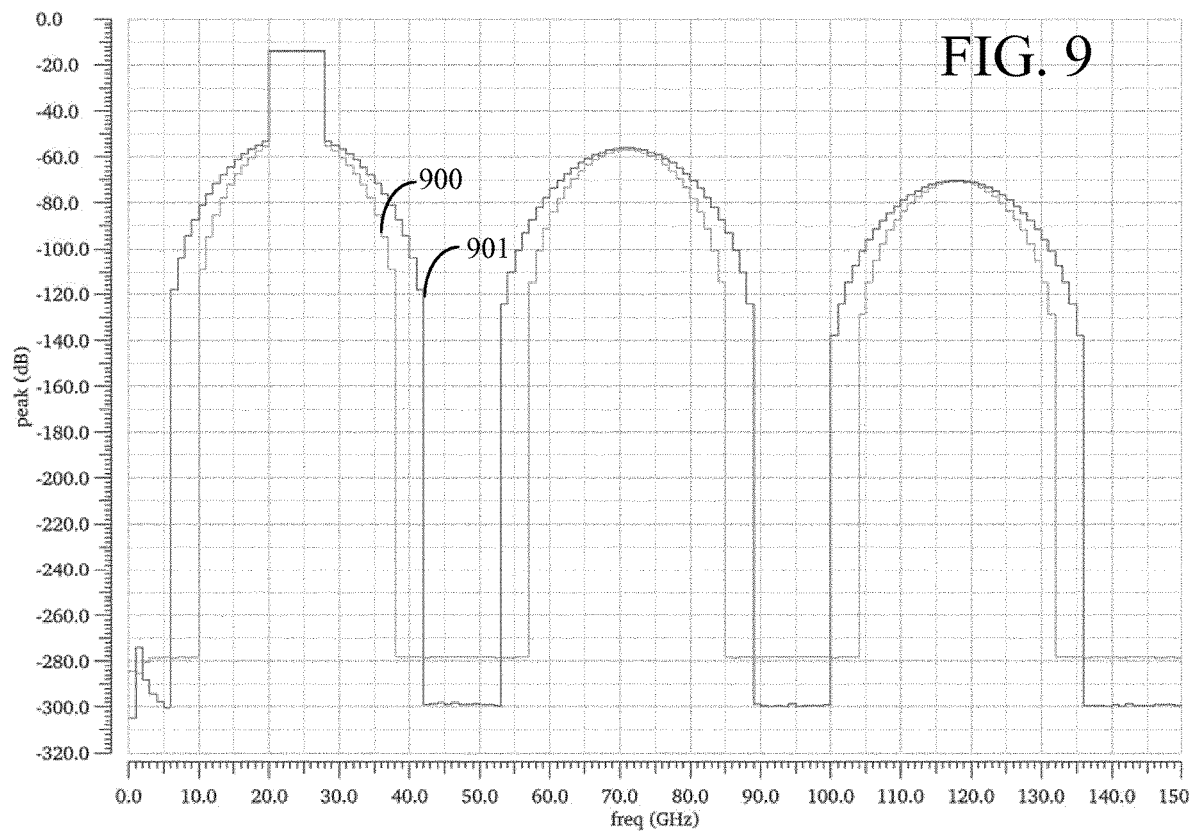

Cancellation of a fifth order non-linearity was then examined. FIG. 9 shows the spectrum with cancellation (phase shifts±18°) 900 and without cancellation 901. It can be seen that the intermodulation spectrum bandwidth is reduced also here, both near the carriers and in the harmonic zones. The absolute reduction of contaminated spectrum is similar as for the third order non-linearity, as anticipated. Since the absolute amount of contaminated spectrum is higher, the relative improvement is less.

Figure 10:
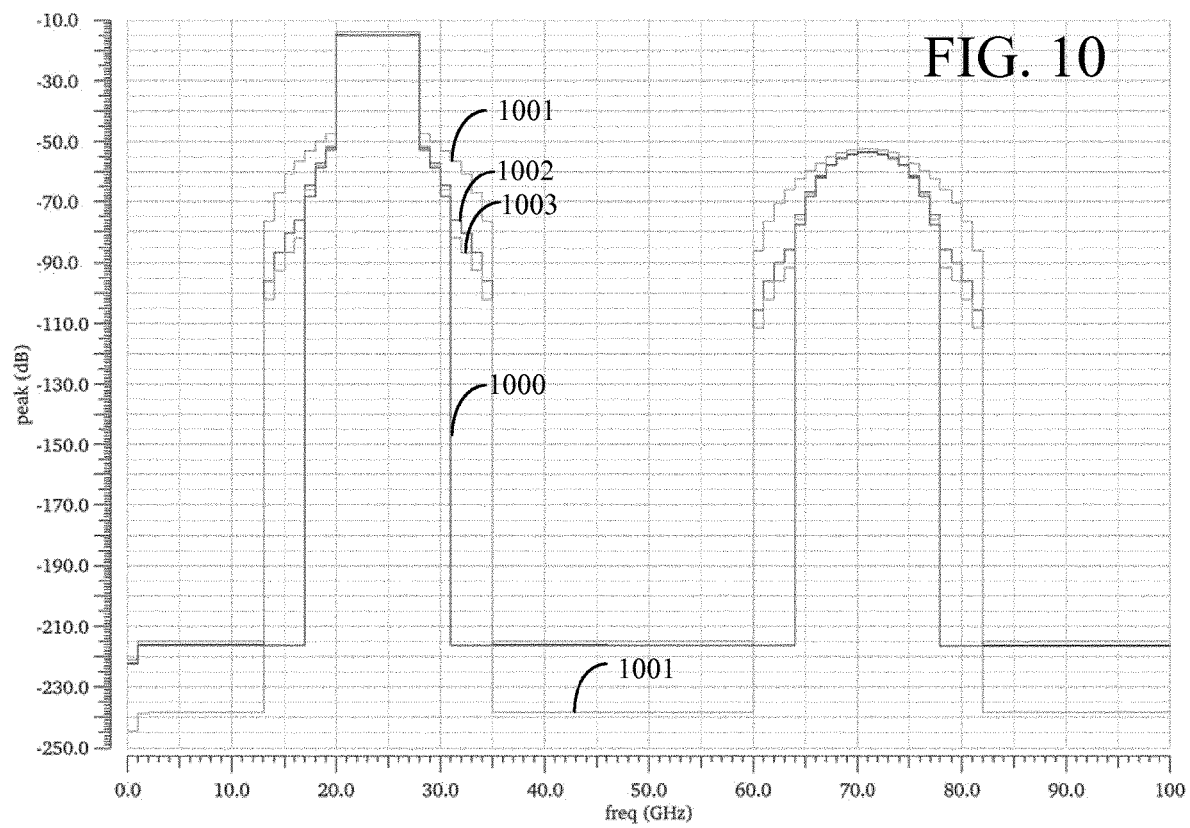

FIG. 10 illustrates an investigation performed regarding sensitivity to errors in the phase angle. The figure shows third order intermodulation cancellation for phase angles of 0° (no cancellation), 28°, 29°, and 30° (ideal phase angle for cancellation); 1001, 1002, 1003, and 1000, respectively. It can be seen that there is a quite high sensitivity to the phase angle; which may be expected since a phase shift of 30° is effectively multiplied 6 times to provide the 180° cancellation. A phase deviation is thus multiplied by the same factor.

The phase can be accurately controlled in the digital baseband in a solution where separate digital-to-analog converters (DACs) are used before each power amplifier. The phase errors after the DACs will be rather frequency flat, and the errors will thus not be multiplied before cancellation. The sensitivity to analog phase errors will thus be typical for the cancellation based techniques herein, where 1° deviation may correspond to about 40 dB.

The well-known image rejection equation (see, for instance, Thomas H. Lee, "The Design of CMOS Radio-Frequency Integrated Circuits, Second Edition", Cambridge University Press, 2003, ISBN: 9780521835398) may be expressed as $$\text{Rejection} = 10 \log\left(\frac{4}{(\Delta\phi)^2 + \varepsilon^2}\right),$$

where the phase error $\Delta\emptyset$ is in radians, and E is relative gain error. Thus, a magnitude error of 5% ($\varepsilon$=0.05), corresponds to 33 dB rejection.

Figure 11:
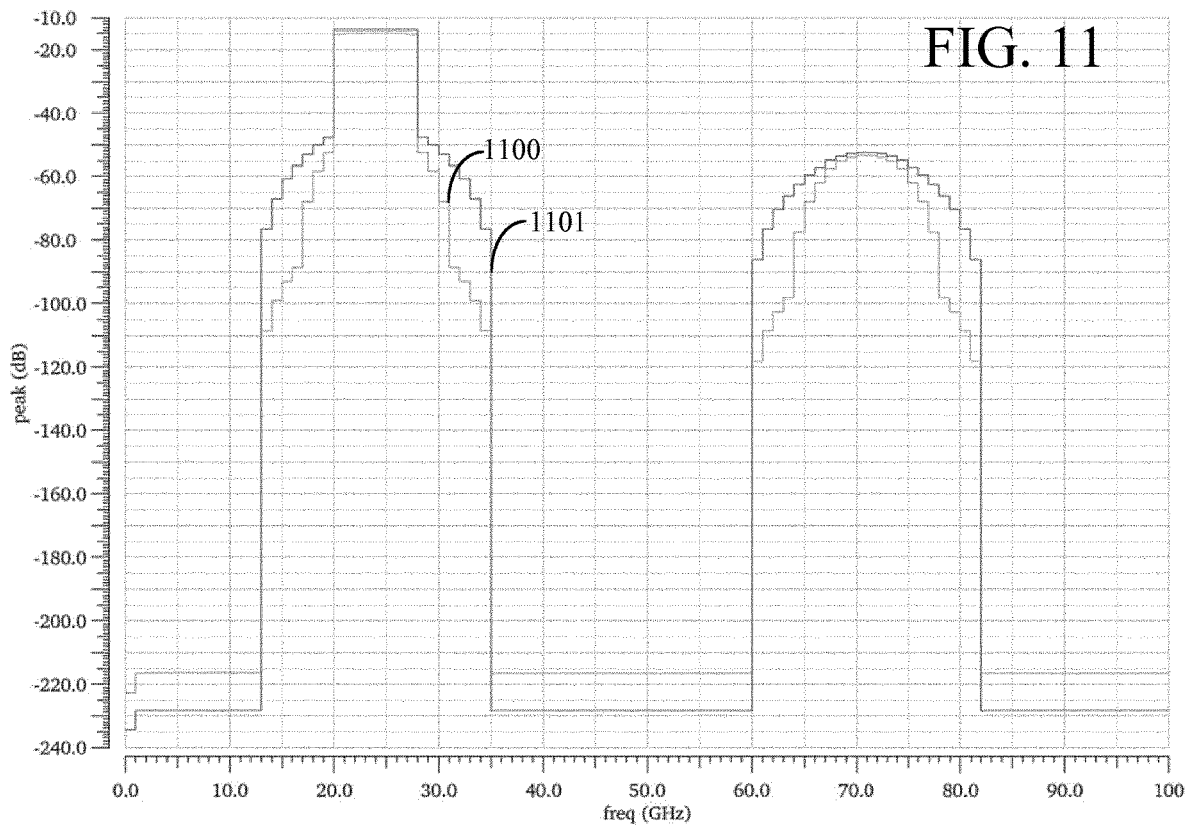

In FIG. 11, the third order coefficient is increased by 5% in one PA. This situation 1100 is compared with a situation without cancellation 1101. It can be seen in the figure that there is a good agreement with the expected rejection of 33 dB.

Figure 12:
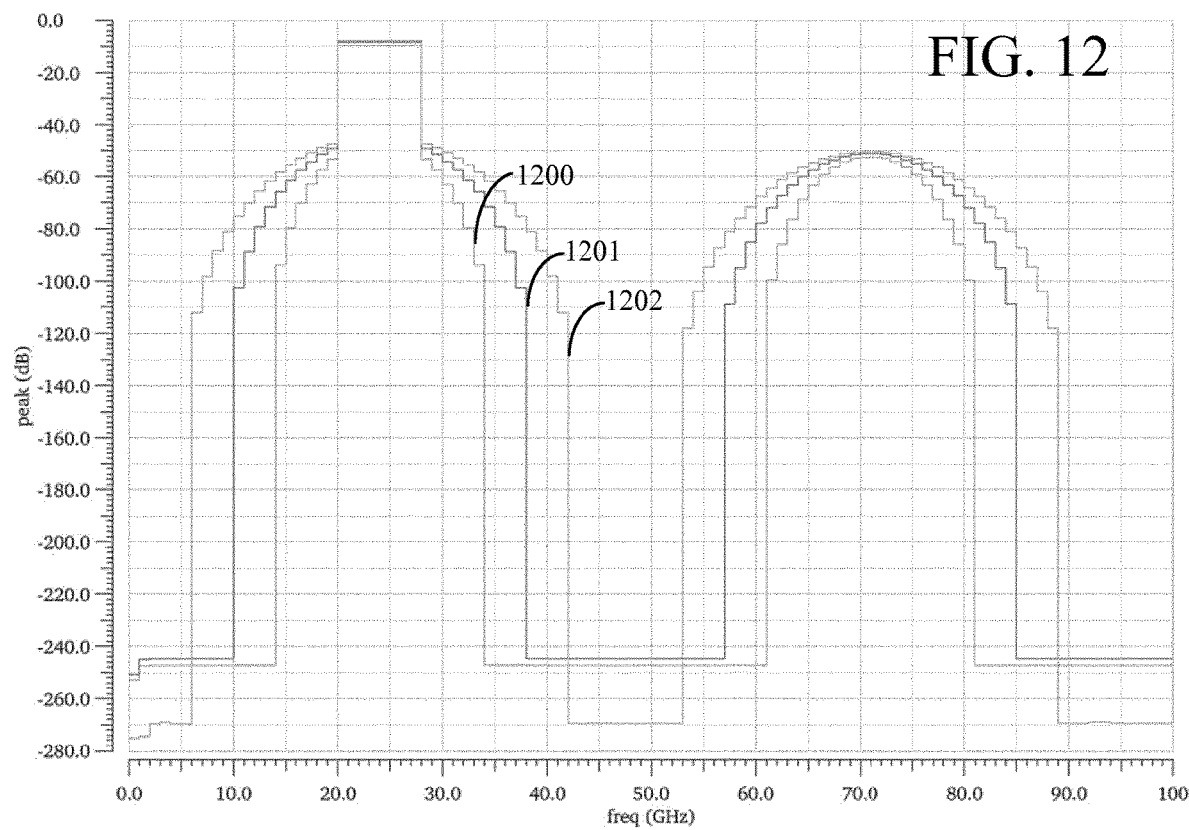

The lower relative improvement with fifth order non-linearity, see FIG. 9, can be addressed by simultaneously cancelling third and fifth order tones. The reason is that also a fifth order non-linearity will create many tones with the same phase relations as a third order one. The cancellation can be achieved by using four phases, with ±12° and ±48° phase shift, as previously described. The resulting spectrum 1200 is shown in FIG. 12, together with the spectra with cancellation of only fifth order 1201, and no cancellation at all 1202. It can be seen that, with simultaneous cancellation of both third and fifth order in a system with four PAs, the spectrum of a fifth order non-linearity can be effectively reduced. This phenomenon can be exploited, for instance, in a phased array transmitter where many PAs are available. In such a system, if digital beam-forming is used, separate digital signals are available for each PA, making accurately controlled phase shifts straight-forward to implement.

A further simulation was performed with an OFDM signal being phase offset with ±30° and applied to a pair of millimeter wavelength (mmW) CMOS PAs modelled by Amplitude Modulation to Amplitude Modulation-Amplitude Modulation to Phase Modulation (AMAM/AMPM) characteristics, where AMAM, or AM2AM, is the nonlinear amplitude characteristic and AMPM, or AM2PM, is the amplitude dependent phase shift. In the simulation, the input power was swept and the adjacent channel leakage ratio (ACLR) of the combined PA outputs was measured with 1301 and without 1300 phase offset (PO). The results are shown in FIG. 13.

Figure 13:
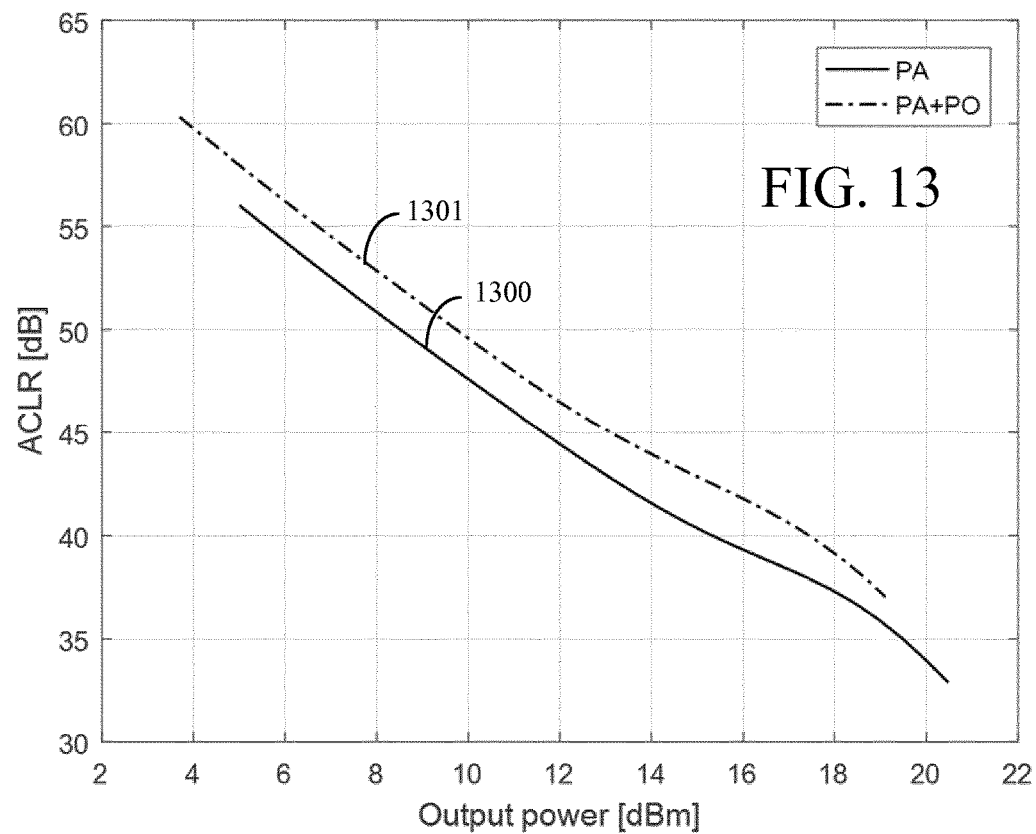

Even though the nonlinear characteristics of the PA are much more complex compared to the polynomial models used in FIG. 13, there is a robust improvement in ACLR of some 3.0-3.5 dB where the cubic nonlinearity dominates.

Figure 14:
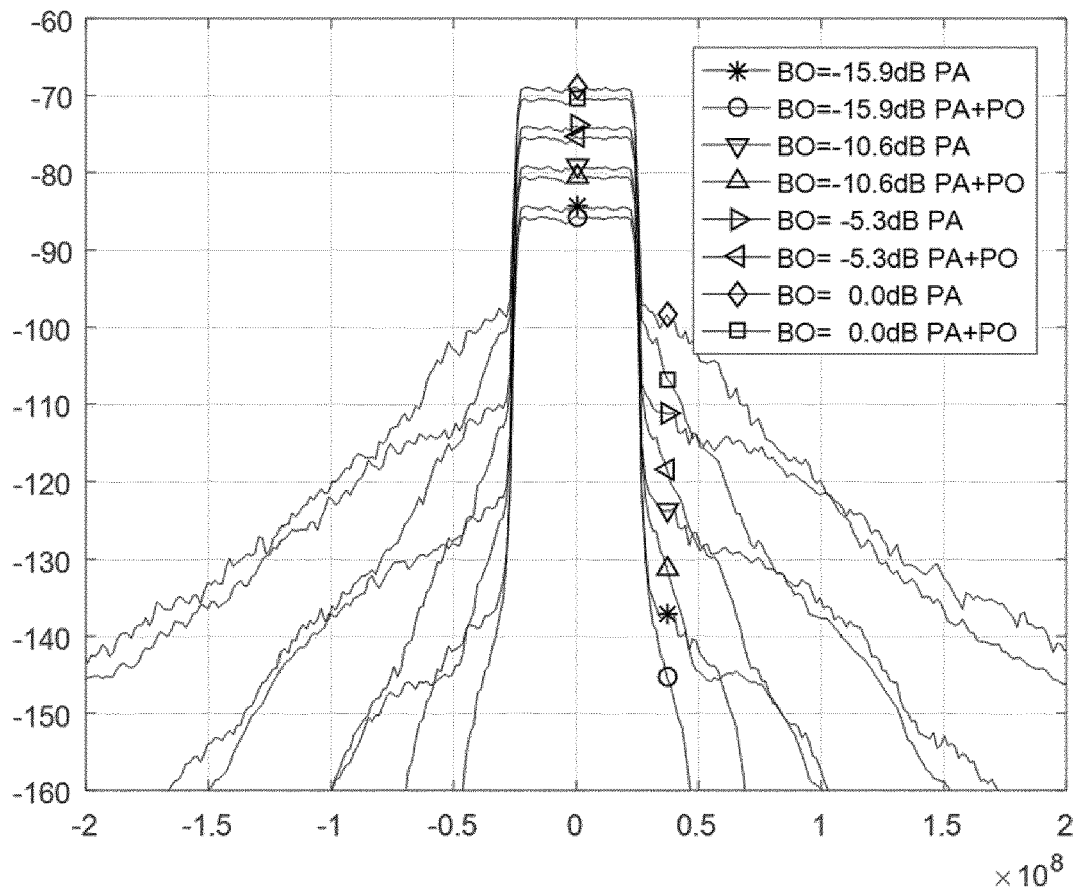

Pushing the PA harder into saturation introduces increasingly larger higher order distortion and a different phase offsetting configuration may then be considered. FIG. 14 shows the spectra of the combined PA outputs for a few different input power levels (different levels of power back-off), with and without phase offsetting (PO), again clearly demonstrating the effectiveness of the proposed technique. As can be seen there is a significant reduction of the amount spectrum that is affected by the highest levels of intermodulation distortion, and this is the case at all signal levels.

Figure 15:
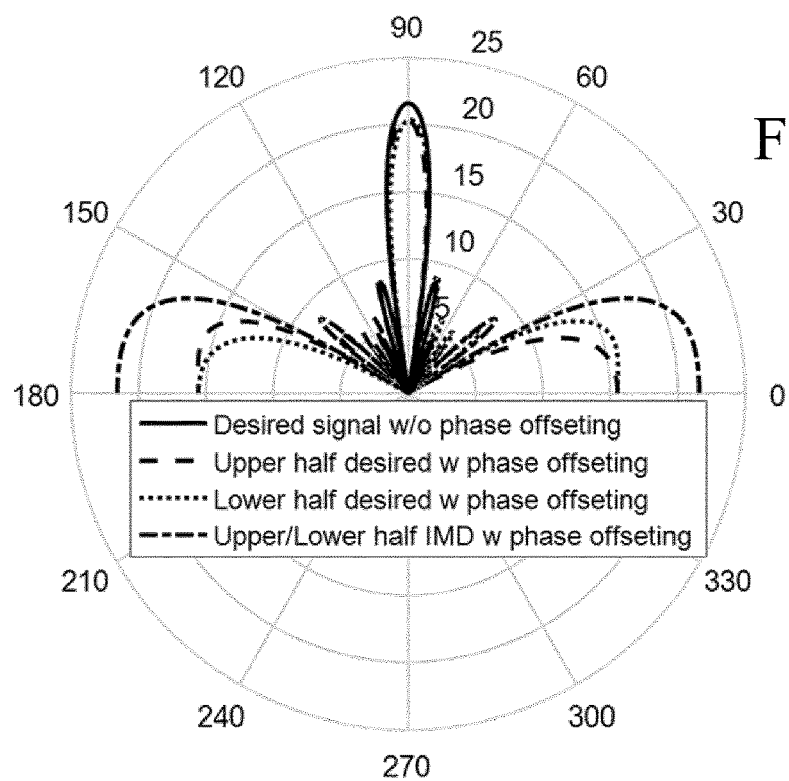
FIGS. 15-18 are plots illustrating example beamforming application according to some embodiments.
Figure 16:
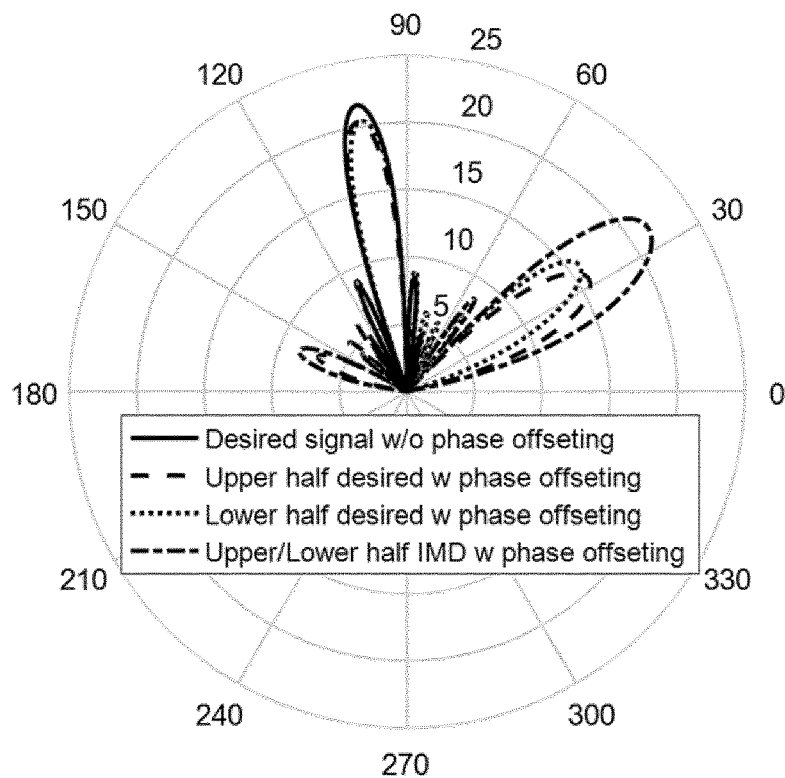
Figure 17:
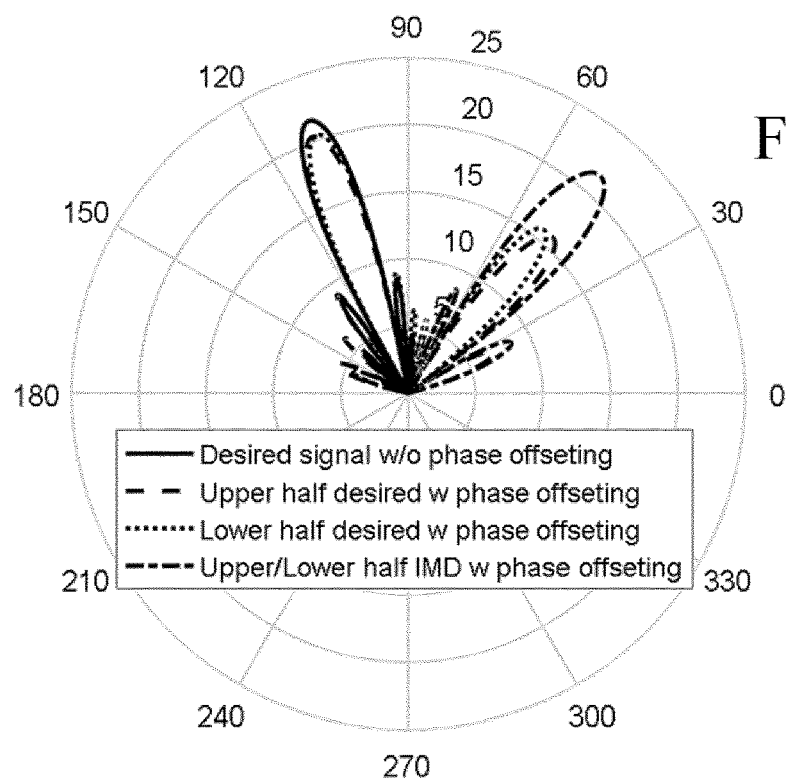

Application to antenna array systems will now be further demonstrated with reference to FIGS. 15-17 and considering a simple case with a linear one-dimensional array of 12 antenna elements having one PA each, where each element is separated by half a wavelength. Furthermore, a signal is considered with ±30° phase offset applied to respective halves of the spectrum. Over the array, the phase shifts are applied as [+30 −30 +30 −30 +30 −30 −30 +30 −30 +30 −30 +30]° for the upper half of the input signal spectrum and as [−30 +30 −30 +30 −30 +30 +30 −30 +30 −30 +30 −30]° for the lower half of the input signal spectrum. This means that the third order intermodulation distortion will have phase offsets [+90 −90 +90 −90 +90 −90 −90 +90 −90 +90 −90 +90]° for the upper half of the signal spectrum and will have phase offsets [−90 +90 −90 +90 −90 +90 +90 −90 +90 −90 +90 −90]° for the lower half of the signal spectrum.

The plot in FIG. 15 shows the radiation pattern for a beam direction in boresight of the array, with isotropic antenna elements, for the different contributions. It is clearly seen that the main lobe direction and width is hardly affected compared to the case where phase offsetting is not applied. Intermodulation (IMD) is still cancelled in the beam direction and only shows up in grating lobes where real antenna elements typically have very low gain.

Figure 18:
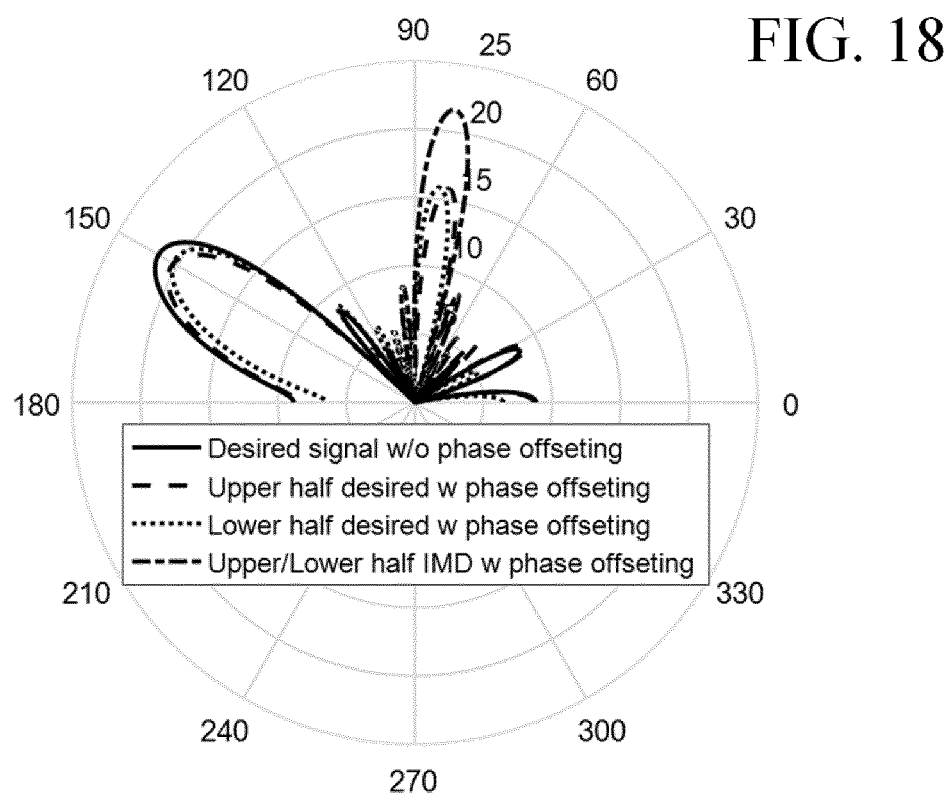

Now, changing the beam direction, the side lobes of the desired signal increase with increasing beam direction as shown in FIGS. 16-18 for a beam direction of 10°, 20°, and 60°, respectively. For beam directions far from boresight, the intermodulation distortion side lobes also become significant in directions where the antenna elements have substantial gain.

Generally, all terms used herein are to be interpreted according to their ordinary meaning in the relevant technical field, unless a different meaning is clearly given and/or is implied from the context in which it is used.

Reference has been made herein to various embodiments. However, a person skilled in the art would recognize numerous variations to the described embodiments that would still fall within the scope of the claims.

For example, the method embodiments described herein discloses example methods through steps being performed in a certain order. However, it is recognized that these sequences of events may take place in another order without departing from the scope of the claims. Furthermore, some method steps may be performed in parallel even though they have been described as being performed in sequence. Thus, the steps of any methods disclosed herein do not have to be performed in the exact order disclosed, unless a step is explicitly described as following or preceding another step and/or where it is implicit that a step must follow or precede another step.

In the same manner, it should be noted that in the description of embodiments, the partition of functional blocks into particular units is by no means intended as limiting. Contrarily, these partitions are merely examples. Functional blocks described herein as one unit may be split into two or more units. Furthermore, functional blocks described herein as being implemented as two or more units may be merged into fewer (e.g. a single) unit.

Any feature of any of the embodiments disclosed herein may be applied to any other embodiment, wherever suitable. Likewise, any advantage of any of the embodiments may apply to any other embodiments, and vice versa.

Hence, it should be understood that the details of the described embodiments are merely examples brought forward for illustrative purposes, and that all variations that fall within the scope of the claims are intended to be embraced therein.

The invention claimed is:

1. A method of a wireless transmitter, for mitigation of distortion caused by non-linear hardware components of the transmitter, wherein mitigation of distortion comprises mitigating at least one intermodulation component, wherein the transmitter is configured to process an input signal having an input signal spectrum that comprises a first part and a second part, and wherein the transmitter comprises two or more signal branches, each signal branch comprising a respective non-linear hardware component, the method comprising:

modifying the input signal for a first one of the signal branches by:
  applying a first phase shift to the first part of the input signal spectrum, wherein the first phase shift has a first sign and a first absolute value; and
  applying a second phase shift to the second part of the input signal spectrum, wherein the second phase shift has a second sign which is opposite to the first sign, and a second absolute value which is equal to the first absolute value, and wherein the first and second parts are non-overlapping;
modifying the input signal for a second one of the signal branches by:
  applying the first phase shift to the second part of the input signal spectrum; and
  applying the second phase shift to the first part of the input signal spectrum; and
feeding the modified input signals to respective ones of the signal branches.

2. The method of claim 1, wherein mitigation of distortion comprises mitigating an intermodulation component by selecting the first absolute value based on an order of the intermodulation component.

3. The method of claim 2, wherein the first absolute value is selected as $\pi/2N$ to mitigate an $N^{th}$ order intermodulation component.

4. The method of claim 1, wherein the two or more signal branches comprises four or more signal branches, the method further comprising:
modifying the input signal for a third one of the signal branches by:
  applying a third phase shift to the first part of the input signal spectrum, wherein the third phase shift has a third sign and a third absolute value; and
  applying a fourth phase shift to the second part of the input signal spectrum, wherein the fourth phase shift has a fourth sign which is opposite to the third sign, and a fourth absolute value which is equal to the third absolute value; and
modifying the input signal for a fourth one of the signal branches by:
  applying the third phase shift to the second part of the input signal spectrum; and
  applying the fourth phase shift to the first part of the input signal spectrum.

5. The method of claim 4, wherein mitigation of distortion comprises mitigating first and second intermodulation components by selecting the first and third absolute values based on orders of the first and second intermodulation components.

6. The method of claim 5, wherein the first and third absolute values are selected as $\pi/2N \pm \pi/2M$, respectively, to mitigate $N^{th}$ and $M^{th}$ order intermodulation components.

7. The method of claim 1, wherein the two or more signal branches comprises two to the power of x or more signal branches, the method further comprising:
modifying the input signal for each one of two to the power of (x−1) of the signal branches by:
  applying different respective first phase shifts to the first part of the input signal spectrum, wherein each respective first phase shift has a respective first sign and a unique respective first absolute value; and
  applying different respective second phase shifts to the second part of the input signal spectrum, wherein each respective second phase shift has a respective second sign which is opposite to a corresponding first sign, and a respective second absolute value which is equal to a corresponding first absolute value; and
modifying the input signal for each one of two to the power of (x−1) other ones of the signal branches by:
  applying the different respective first phase shifts to the second part of the input signal spectrum; and
  applying the different respective second phase shifts to the first part of the input signal spectrum.

8. The method of claim 7, wherein mitigation of distortion comprises mitigating x intermodulation components by selecting the unique respective first absolute values based on orders of the intermodulation components.

9. The method of claim 8, wherein the unique respective first absolute values are selected as $\pi/2N \pm \pi/2M \pm \ldots \pm \pi/2L$, respectively, to mitigate intermodulation components of orders N, M, ..., L.

10. The method of claim 1, further comprising dynamically selecting one or more intermodulation components for mitigation.

11. The method of claim 1, further comprising selecting a partition frequency, wherein the first and second parts of the input signal spectrum reside, respectively, on a first and second side of the partition frequency.

12. The method of claim 11, wherein the partition frequency is selected based on respective distortion requirements of frequency intervals adjacent to the input signal spectrum.

13. The method of claim 1, wherein the first and second parts of the input signal spectrum are, respectively, a first half of the input signal spectrum and a second half of the input signal spectrum.

14. The method of claim 1, wherein the first part of the input signal spectrum is smaller than half of the input signal spectrum and the second part of the input signal spectrum is larger than half of the input signal spectrum.

15. The method of claim 1, wherein the input signal is a carrier aggregation signal, and wherein each carrier of the carrier aggregation signal is associated with a respective part of the input signal spectrum.

16. The method of claim 1, further comprising generating an output signal for transmission by combining constituent output signals of the signal branches.

17. The method of claim 16, further comprising transmitting the output signal.

18. The method of claim 1, further comprising transmitting an output signal via beamforming by feeding constituent output signals of the signal branches to respective antenna elements of a beamforming antenna array.

19. The method of claim 1, wherein each of the respective non-linear hardware components comprises a respective non-linear power amplifier.

20. A non-transitory computer readable medium, having thereon a computer program comprising program instructions, the computer program being loadable into a data processing unit and configured to cause execution of a method when the computer program is run by the data processing unit, where the method is a method of a wireless transmitter, for mitigation of distortion caused by non-linear hardware components of the transmitter, wherein mitigation of distortion comprises mitigating at least one intermodulation component, wherein the transmitter is configured to process an input signal having an input signal spectrum that comprises a first part and a second part, and wherein the transmitter comprises two or more signal branches, each signal branch comprising a respective non-linear hardware component, the method comprising:

modifying the input signal for a first one of the signal branches by:
applying a first phase shift to a first part of the input signal spectrum, wherein the first phase shift has a first sign and a first absolute value; and
applying a second phase shift to a second part of the input signal spectrum, wherein the second phase shift has a second sign which is opposite to the first sign, and a second absolute value which is equal to the first absolute value, and wherein the first and second parts are non-overlapping;
modifying the input signal for a second one of the signal branches by:
applying the first phase shift to the second part of the input signal spectrum; and
applying the second phase shift to the first part of the input signal spectrum; and
feeding the modified input signals to respective ones of the signal branches.

21. An apparatus for a wireless transmitter, for mitigation of distortion caused by non-linear hardware components of the transmitter, wherein mitigation of distortion comprises mitigation of at least one intermodulation component, wherein the transmitter is configured to process an input signal having an input signal spectrum that comprises a first part and a second part, and wherein the transmitter comprises two or more signal branches, each signal branch comprising a respective non-linear hardware component, the apparatus comprising controlling circuitry configured to cause the mitigation of distortion by causing:
modification of the input signal for a first one of the signal branches by:
application of a first phase shift to a first part of the input signal spectrum, wherein the first phase shift has a first sign and a first absolute value; and
application of a second phase shift to a second part of the input signal spectrum, wherein the second phase shift has a second sign which is opposite to the first sign, and a second absolute value which is equal to the first absolute value, and wherein the first and second parts are non-overlapping;
modification of the input signal for a second one of the signal branches by:
application of the first phase shift to the second part of the input signal spectrum; and
application of the second phase shift to the first part of the input signal spectrum; and
feeding of the modified input signals to respective ones of the signal branches.

22. The apparatus of claim 21, wherein the controlling circuitry is configured to cause the mitigation of distortion, comprising mitigation of an intermodulation component, by causing selection of the first absolute value based on an order of the intermodulation component.

23. The apparatus of claim 22, wherein the controlling circuitry is configured to cause selection of the first absolute value as $\pi/2N$ to mitigate an $N^{th}$ order intermodulation component.

24. The apparatus of claim 21, wherein the two or more signal branches comprises four or more signal branches, and wherein the controlling circuitry is further configured to cause:
modification of the input signal for a third one of the signal branches by:
application of a third phase shift to the first part of the input signal spectrum, wherein the third phase shift has a third sign and a third absolute value; and
application of a fourth phase shift to the second part of the input signal spectrum, wherein the fourth phase shift has a fourth sign which is opposite to the third sign, and a fourth absolute value which is equal to the third absolute value; and
modification of the input signal for a fourth one of the signal branches by:
application of the third phase shift to the second part of the input signal spectrum; and
application of the fourth phase shift to the first part of the input signal spectrum.

25. The apparatus of claim 24, wherein the controlling circuitry is configured to cause the mitigation of distortion, comprising mitigation of first and second intermodulation components, by causing selection of the first and third absolute values based on orders of the first and second intermodulation components.

26. The apparatus of claim 25, wherein the controlling circuitry is configured to cause selection of the first and third absolute values as $\pi/2N\pm\pi/2M$, respectively, to mitigate $N^{th}$ and $M^{th}$ order intermodulation components.

27. The apparatus of claim 21, wherein the two or more signal branches comprises two to the power of x or more signal branches, and wherein the controlling circuitry is further configured to cause:
modification of the input signal for each one of two to the power of (x−1) of the signal branches by:
application of different respective first phase shifts to the first part of the input signal spectrum, wherein each respective first phase shift has a respective first sign and a unique respective first absolute value; and
application of different respective second phase shifts to the second part of the input signal spectrum, wherein each respective second phase shift has a respective second sign which is opposite to a corresponding first sign, and a respective second absolute value which is equal to a corresponding first absolute value; and
modification of the input signal for each one of two to the power of (x−1) other ones of the signal branches by:
application of the different respective first phase shifts to the second part of the input signal spectrum; and
application of the different respective second phase shifts to the first part of the input signal spectrum.

28. The apparatus of claim 27, wherein the controlling circuitry is configured to cause the mitigation of distortion, comprising mitigation of x intermodulation components, by causing selection of the unique respective first absolute values based on orders of the intermodulation components.

29. The apparatus of claim 28, wherein the controlling circuitry is configured to cause selection of the unique respective first absolute values as $\pi/2N\pm\pi/2M\pm \ldots \pm\pi/2L$, respectively, to mitigate intermodulation components of orders N, M, . . . , L.

30. The apparatus of claim 21, wherein the controlling circuitry is further configured to cause dynamic selection of one or more intermodulation components for mitigation.

31. The apparatus of claim 21, wherein the controlling circuitry is further configured to cause selection of a partition frequency, wherein the first and second parts of the input signal spectrum reside, respectively, on a first and second side of the partition frequency.

32. The apparatus of claim 31, wherein the controlling circuitry is configured to cause the selection the partition frequency based on respective distortion requirements of frequency intervals adjacent to the input signal spectrum.

33. The apparatus of claim 21, wherein the first and second parts of the input signal spectrum are, respectively, a first half of the input signal spectrum and a second half of the input signal spectrum.

34. The apparatus of claim 21, wherein the first part of the input signal spectrum is smaller than half of the input signal spectrum and the second part of the input signal spectrum is larger than half of the input signal spectrum.

35. The apparatus of claim 21, wherein the input signal is a carrier aggregation signal, and wherein each carrier of the carrier aggregation signal is associated with a respective part of the input signal spectrum.

36. The apparatus of claim 21, wherein the controlling circuitry is further configured to cause generation of an output signal for transmission by causing combining of constituent output signals of the signal branches.

37. The apparatus of claim 36, wherein the controlling circuitry is further configured to cause transmission of the output signal.

38. The apparatus of claim 21, wherein the controlling circuitry is further configured to cause transmission of an output signal via beamforming by feeding constituent output signals of the signal branches to respective antenna elements of a beamforming antenna array.

39. The apparatus of claim 21, wherein each of the respective non-linear hardware components comprises a respective non-linear power amplifier.

40. A wireless transmitter comprising the apparatus of claim 21.

41. A communication device comprising the apparatus of claim 21.

* * * * *